(12) United States Patent
Ma et al.

(10) Patent No.: US 12,396,209 B2
(45) Date of Patent: Aug. 19, 2025

(54) SEMICONDUCTOR DEVICE AND METHOD

(71) Applicant: Taiwan Semiconductor Manufacturing Co., Ltd., Hsinchu (TW)

(72) Inventors: Shao-Yang Ma, Tainan (TW); Cheng-Yen Wen, Taichung (TW); Li-Li Su, ChuBei (TW); Chii-Horng Li, Zhubei (TW); Yee-Chia Yeo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 437 days.

(21) Appl. No.: 17/663,165

(22) Filed: May 12, 2022

(65) Prior Publication Data
US 2023/0369502 A1  Nov. 16, 2023

(51) Int. Cl.
H10D 30/67   (2025.01)
H01L 21/02   (2006.01)
H10D 30/01   (2025.01)
H10D 62/10   (2025.01)

(52) U.S. Cl.
CPC ... *H10D 30/6713* (2025.01); *H01L 21/02576* (2013.01); *H01L 21/02592* (2013.01); *H01L 21/02667* (2013.01); *H10D 30/031* (2025.01); *H10D 30/6735* (2025.01); *H10D 30/6757* (2025.01); *H10D 62/118* (2025.01)

(58) Field of Classification Search
None
See application file for complete search history.

(56) References Cited

U.S. PATENT DOCUMENTS

| | | | |
|---|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |

(Continued)

FOREIGN PATENT DOCUMENTS

| | | | | |
|---|---|---|---|---|
| CN | 113299628 A | * | 8/2021 | ............ B82Y 40/00 |
| CN | 115527890 A | * | 12/2022 | ....... H01L 21/67253 |

(Continued)

OTHER PUBLICATIONS

Changhae Park et al., "Critical Angles for Channeling of Boron Ions Implanted into Single-Crystal Silicon" J. Electrochem. Soc., vol. 138, No. 7, Jul. 1991, pp. 2107-2115.

*Primary Examiner* — Michael Lebentritt
(74) *Attorney, Agent, or Firm* — Slater Matsil, LLP

(57) ABSTRACT

A semiconductor device including a seeding layer in the source/drain region and a method of forming is provided. The semiconductor device may include a plurality of nanostructures over a substrate, a gate structure wrapping around the plurality of nanostructures, a source/drain region adjacent the plurality of nanostructures, and inner spacers between the source/drain region and the gate structure. The source/drain region may include a polycrystalline seeding layer covering sidewalls of the plurality of nanostructures and sidewalls of the inner spacers, and a semiconductor layer over the seeding layer. The semiconductor layer may have a higher dopant concentration than the seeding layer.

20 Claims, 35 Drawing Sheets

(56) References Cited

U.S. PATENT DOCUMENTS

| | | | |
|---|---|---|---|
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 2018/0163130 A1 | 6/2018 | Kim et al. | |
| 2021/0104616 A1* | 4/2021 | Su | H01L 29/78696 |
| 2021/0375685 A1 | 12/2021 | Xie et al. | |
| 2022/0037520 A1 | 2/2022 | More et al. | |
| 2022/0140151 A1 | 5/2022 | Yeong et al. | |
| 2023/0121210 A1* | 4/2023 | Wang | H01L 27/092 257/774 |
| 2023/0317785 A1* | 10/2023 | Yang | H01L 29/42392 257/288 |
| 2023/0402509 A1* | 12/2023 | Hsu | H01L 29/66439 |
| 2023/0420525 A1* | 12/2023 | Wang | H01L 29/0673 |
| 2024/0079239 A1* | 3/2024 | Wang | H01L 21/30625 |

FOREIGN PATENT DOCUMENTS

| | | | | |
|---|---|---|---|---|
| CN | 115700921 A | * | 2/2023 | H01L 29/78672 |
| CN | 116779680 A | * | 9/2023 | H01L 21/76224 |
| TW | 201821595 A | | 6/2018 | |

\* cited by examiner

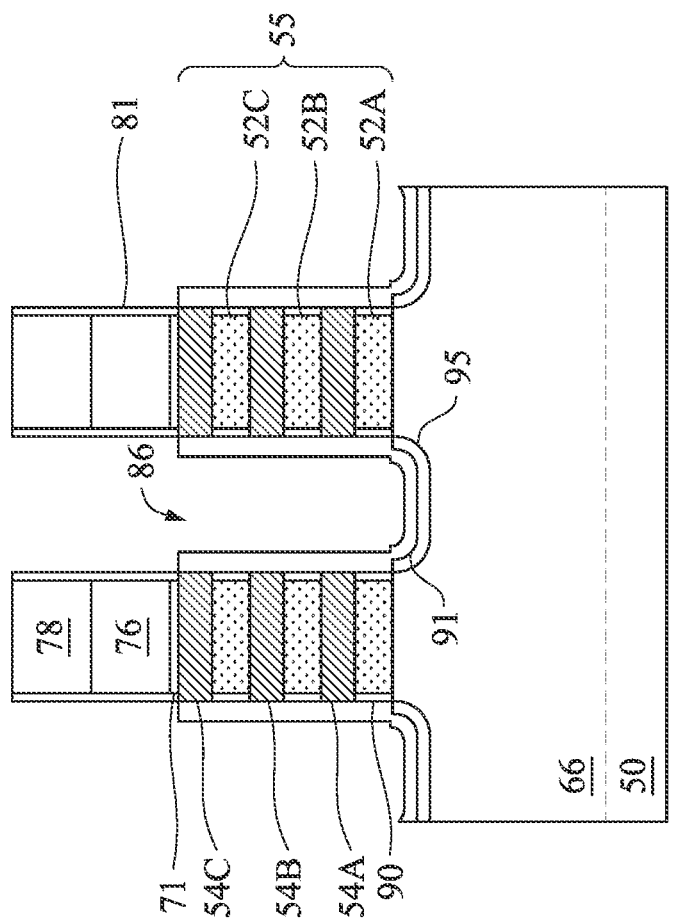
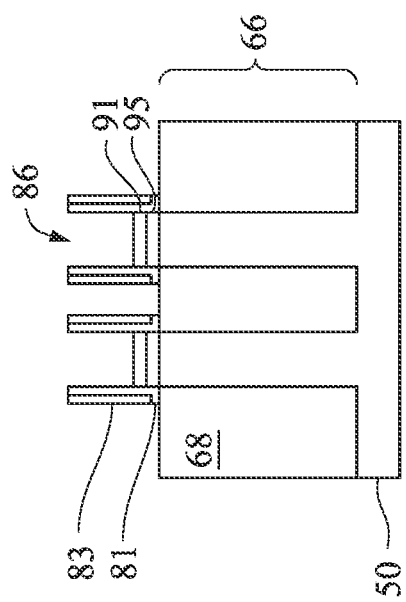
Fig. 23B
Fig. 23A

SEMICONDUCTOR DEVICE AND METHOD

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 22A, 22B, 23A, 23B, 24A, and 24B are cross-sectional views of intermediate stages in the manufacturing of nano-FETs, in accordance with some embodiments.

DETAILED DESCRIPTION

Figure 1:
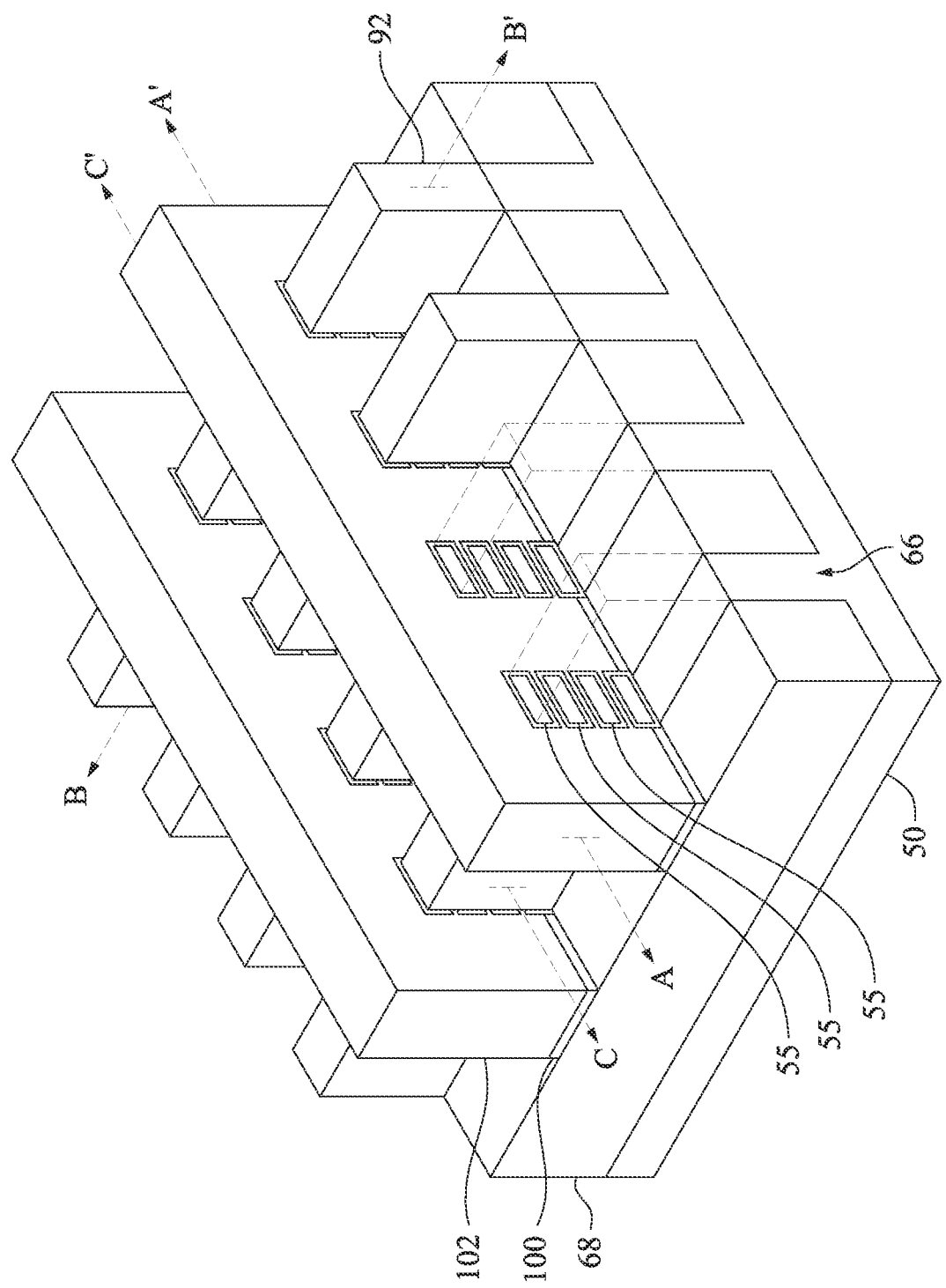
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments are described below in a particular context, a die comprising nano-FETs. Various embodiments may be applied, however, to dies comprising other types of transistors (e.g., fin field effect transistors (FinFETs), planar transistors, or the like) in lieu of or in combination with the nano-FETs. In some embodiments, a continuous seeding layer is formed over sidewalls of nanostructures, gate inner spacers, and a substrate, prior to the formation of epitaxial source/drain regions over the seeding layers. By forming the seeding layer, the nucleation sites for the growth of the epitaxial source/drain regions are more abundant and more evenly distributed, which may increase uniformity of the epitaxial source/drain regions and reduce defects, such as voids and stacking faults, thereby improving the overall performance of the nano-FETs.

FIG. 1 illustrates an example of nano-FETs (e.g., nanowire FETs, nanosheet FETs, or the like) in a three-dimensional view, in accordance with some embodiments. The nano-FETs comprise nanostructures 55 (e.g., nanosheets, nanowire, or the like) over fins 66 on a substrate 50 (e.g., a semiconductor substrate), wherein the nanostructures 55 act as channel regions for the nano-FETs. The nanostructure 55 may include p-type nanostructures, n-type nanostructures, or a combination thereof. Shallow trench isolation (STI) regions 68 are disposed between adjacent fins 66, which may protrude above and from between neighboring STI regions 68. Although the STI regions 68 are described or illustrated as being separate from the substrate 50, as used herein, the term "substrate" may refer to the semiconductor substrate alone or a combination of the semiconductor substrate and the isolation regions. Additionally, although a bottom portion of the fins 66 are illustrated as being a single material continuous with the substrate 50, the bottom portion of the fins 66 and/or the substrate 50 may comprise a single material or a plurality of materials. In this context, the fins 66 refer to the portion extending between the neighboring STI regions 68.

Gate dielectric layers 100 are over top surfaces of the fins 66 and along top surfaces, sidewalls, and bottom surfaces of the nanostructures 55. Gate electrodes 102 are over the gate dielectric layers 100. Epitaxial source/drain regions 92 are disposed on the fins 66 on opposing sides of the gate dielectric layers 100 and the gate electrodes 102.

FIG. 1 further illustrates reference cross-sections that are used in later figures. Cross-section A-A' is along a longitudinal axis of a gate electrode 102 and in a direction, for example, perpendicular to the direction of current flow between the epitaxial source/drain regions 92 of a nano-FET. Cross-section B-B' is perpendicular to cross-section A-A' and is parallel to a longitudinal axis of a fins 66 of the nano-FET and in a direction of, for example, a current flow between the epitaxial source/drain regions 92 of the nano-FET. Cross-section C-C' is parallel to cross-section A-A' and extends through epitaxial source/drain regions of the nano-FET. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in planar devices, such as planar FETs or in FinFETs.

FIGS. 2 through 21C are cross-sectional views of intermediate stages in the manufacturing of nano-FETs, in accordance with some embodiments. FIGS. 2 through 5, 6A, 14A, 15A, 16A, 17A, 18A, 19A, 20A, 21A, and 21D illustrate reference cross-section A-A' illustrated in FIG. 1. FIGS. 6B, 7B, 8B, 9B, 10B, 11B, 11C, 12B, 12C, 13B, 13D, 14B, 15B, 16B, 17B, 18B, 19B, 20B, 21B, 21E, 22B, 23B, and 24A illustrate reference cross-section B-B' illustrated in FIG. 1. FIGS. 7A, 8A, 9A, 10A, 11A, 12A, 13A, 13C, 14C, 19C, 20C, 21C, 22A, 23A, and 24B illustrate reference cross-section C-C' illustrated in FIG. 1.

Figure 2:
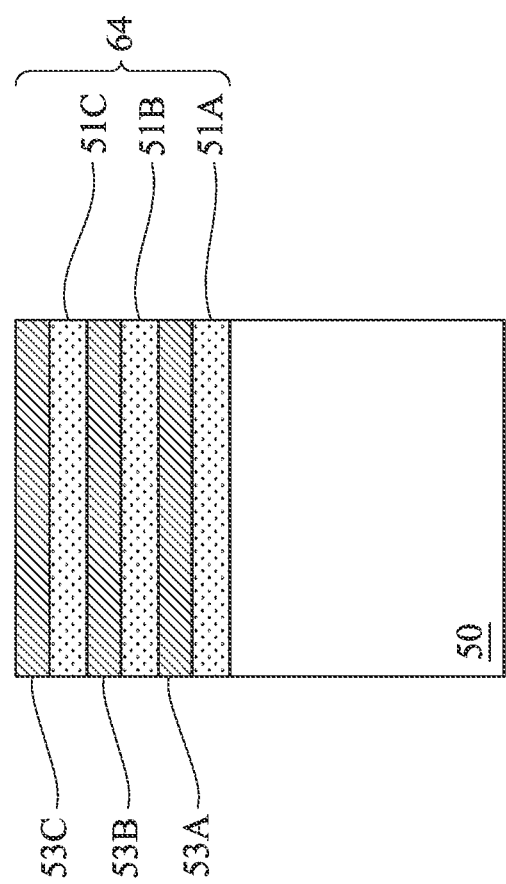
FIGS. 2, 3, 4, 5, 6A, 6B, 7A, 7B, 8A, 8B, 9A, 9B, 10A, 10B, 11A, 11B, 11C, 12A, 12B, 12C, 13A, 13B, 13C, 13D, 14A, 14B, 14C, 15A, 15B, 16A, 16B, 17A, 17B, 18A, 18B, 19A, 19B, 19C, 20A, 20B, 20C, 21A, 21B, 21C, 21D, and 21E are cross-sectional views of intermediate stages in the manufacturing of nano-FETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

Further in FIG. 2, a multi-layer stack 64 is formed over the substrate 50. The multi-layer stack 64 includes alternating layers of first semiconductor layers 51A-C (collectively referred to as first semiconductor layers 51) and second semiconductor layers 53A-C (collectively referred to as second semiconductor layers 53). The second semiconductor layers 53 will be removed and the first semiconductor layers 51 will be patterned to form channel regions of nano-FETs in the p-type region. Also, the first semiconductor layers 51 will be removed and the second semiconductor layers 53 will be patterned to form channel regions of nano-FETs in the n-type region.

The first semiconductor layers 51 may be removed and the second semiconductor layers 53 may be patterned to form channel regions of nano-FETS in both the n-type region and the p-type region. In other embodiments, the second semiconductor layers 53 may be removed and the first semiconductor layers 51 may be patterned to form channel regions of nano-FETs in both the n-type region and the p-type region. In such embodiments, the channel regions in both the n-type region and the p-type region may have a same material composition (e.g., silicon, or the another semiconductor material) and be formed simultaneously.

The multi-layer stack 64 is illustrated as including three layers of each of the first semiconductor layers 51 and the second semiconductor layers 53 for illustrative purposes. In some embodiments, the multi-layer stack 64 may include any number of the first semiconductor layers 51 and the second semiconductor layers 53. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like. In various embodiments, one of the first semiconductor layers 51 and the second semiconductor layers 53 may be formed of a first semiconductor material suitable for p-type nano-FETs, such as silicon germanium, or the like, and the other of the first semiconductor layers 51 and the second semiconductor layers 53 may be formed of a second semiconductor material suitable for n-type nano-FETs, such as silicon, silicon carbon, or the like.

The first semiconductor materials and the second semiconductor materials may be materials having a high-etch selectivity to one another. As such, the first semiconductor layers 51 of the first semiconductor material may be removed without significantly removing the second semiconductor layers 53 of the second semiconductor material, thereby allowing the second semiconductor layers 53 to be patterned to form channel regions of, e.g., n-type nano-FETs. Similarly, the second semiconductor layers 53 of the second semiconductor material may be removed without significantly removing the first semiconductor layers 51 of the first semiconductor material in the p-type region, thereby allowing the first semiconductor layers 51 to be patterned to form channel regions of, e.g., p-type nano-FETs. Additionally, in some embodiments, the first semiconductor layers 51 and the second semiconductor layers 53 may comprise the same materials in the p-type region and the n-type region. In other embodiments, one or both of the first semiconductor layers 51 and the second semiconductor layers 53 may be different materials or formed in a different order in the p-type regions and the n-type regions.

Figure 3:
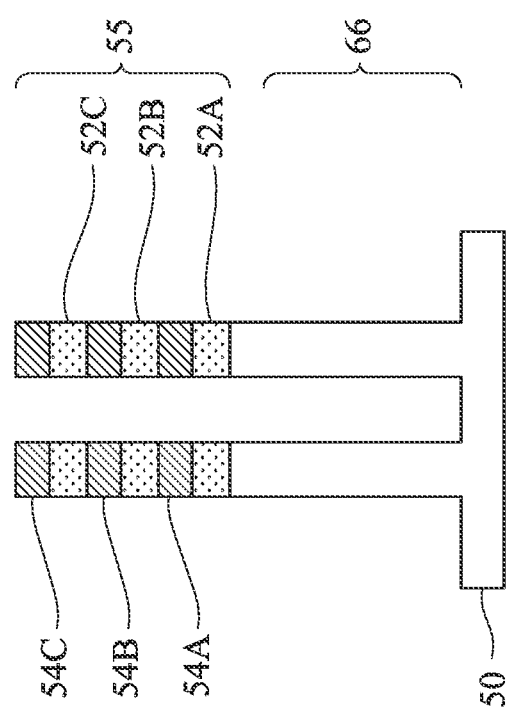

Referring now to FIG. 3, fins 66 are formed in the substrate 50 and nanostructures 55 are formed in the multi-layer stack 64. In some embodiments, the nanostructures 55 and the fins 66 may be formed in the multi-layer stack 64 and the substrate 50, respectively, by etching trenches in the multi-layer stack 64 and the substrate 50. The etching may be any acceptable etch process, such as a reactive ion etch (RIE), neutral beam etch (NBE), the like, or a combination thereof. The etching may be anisotropic. Forming the nanostructures 55 by etching the multi-layer stack 64 may further define first nanostructures 52A-C (collectively referred to as the first nanostructures 52) from the first semiconductor layers 51 and define second nanostructures 54A-C (collectively referred to as the second nanostructures 54) from the second semiconductor layers 53. The first nanostructures 52 and the second nanostructures 54 may further be collectively referred to as nanostructures 55.

For purposes of illustration, an n-type region with the second nanostructures 54 as channel regions is used as an example for the following discussion. Similar processes may also be applied to the p-type region. FIG. 3 illustrates that two fins are formed, in other embodiments a different number of fins may be formed.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 66.

While each of the fins 66 and the nanostructures 55 are illustrated as having a consistent width throughout, in some embodiments, the fins 66 and/or the nanostructures 55 may have tapered sidewalls such that a width of each of the fins 66 and/or the nanostructures 55 continuously increases in a direction towards the substrate 50. In such embodiments, each of the nanostructures 55 may have a different width and be trapezoidal in shape.

Figure 4:
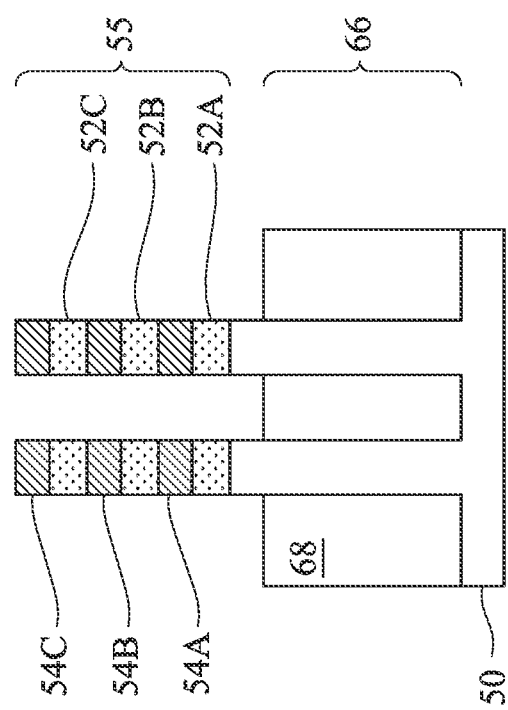

In FIG. 4, STI regions 68 are formed adjacent the fins 66. The STI regions 68 may be formed by depositing an insulation material over the substrate 50, the fins 66, and nanostructures 55, and between adjacent fins 66. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An annealing process may be performed once the insulation material is formed. In an embodiment, the insulation material is formed such that excess insulation material covers the nanostructures 55. Although the insulation material is illustrated as a single layer, some embodiments may utilize multiple layers. For example, in some embodiments a liner (not separately illustrated) may first be formed along a surface of the substrate 50, the fins 66, and the nanostructures 55. Thereafter, a fill material, such as those discussed above may be formed over the liner.

A removal process is then applied to the insulation material to remove excess insulation material over the nanostructures 55. In some embodiments, a planarization process such as a chemical mechanical polish (CMP), an etch-back process, combinations thereof, or the like may be utilized. The planarization process exposes the nanostructures 55 such that top surfaces of the nanostructures 55 and the insulation material are level after the planarization process is complete.

The insulation material is then recessed to form the STI regions 68. The insulation material is recessed such that upper portions of fins 66 protrude from between neighboring STI regions 68. Further, the top surfaces of the STI regions 68 may have a flat surface as illustrated, a convex surface, a concave surface (such as dishing), or a combination thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the fins 66 and the nanostructures 55). For example, an oxide removal using, for example, dilute hydrofluoric (dHF) acid may be used.

The process described above with respect to FIGS. 2 through 4 is just one example of how the fins 66 and the nanostructures 55 may be formed. In some embodiments, the fins 66 and/or the nanostructures 55 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 66 and/or the nanostructures 55. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Further in FIG. 4, appropriate wells (not separately illustrated) may be formed in the fins 66 and the nanostructures 55. In embodiments with different well types, different implant steps for the n-type region and the p-type region may be achieved using a photoresist or other masks (not separately illustrated). For example, a photoresist may be formed over the fins 66, the nanostructures 55, and the STI regions 68 in the n-type region and the p-type region. The photoresist is patterned to expose the p-type region. The photoresist can be formed by using a spin-on technique and can be patterned using acceptable photolithography techniques. Once the photoresist is patterned, an n-type impurity implant is performed in the p-type region, and the photoresist may act as a mask to substantially prevent n-type impurities from being implanted into the n-type region. The n-type impurities may be phosphorus, arsenic, antimony, or the like implanted in the region to a concentration in a range from about $10^{13}$ atoms/cm$^3$ to about 1014 atoms/cm$^3$. After the implant, the photoresist is removed, such as by an acceptable ashing process.

Following or prior to the implanting of the p-type region, a photoresist or other masks (not separately illustrated) is formed over the fins 66, the nanostructures 55, and the STI regions 68 in the p-type region and the n-type region. The photoresist is patterned to expose the n-type region. The photoresist can be formed by using a spin-on technique and can be patterned using acceptable photolithography techniques. Once the photoresist is patterned, a p-type impurity implant may be performed in the n-type region, and the photoresist may act as a mask to substantially prevent p-type impurities from being implanted into the p-type region. The p-type impurities may be boron, boron fluoride, indium, or the like implanted in the region to a concentration in a range from about $10^{13}$ atoms/cm$^3$ to about 1014 atoms/cm$^3$. After the implant, the photoresist may be removed, such as by an acceptable ashing process.

After the implants of the n-type region and the p-type region, an annealing process may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5:
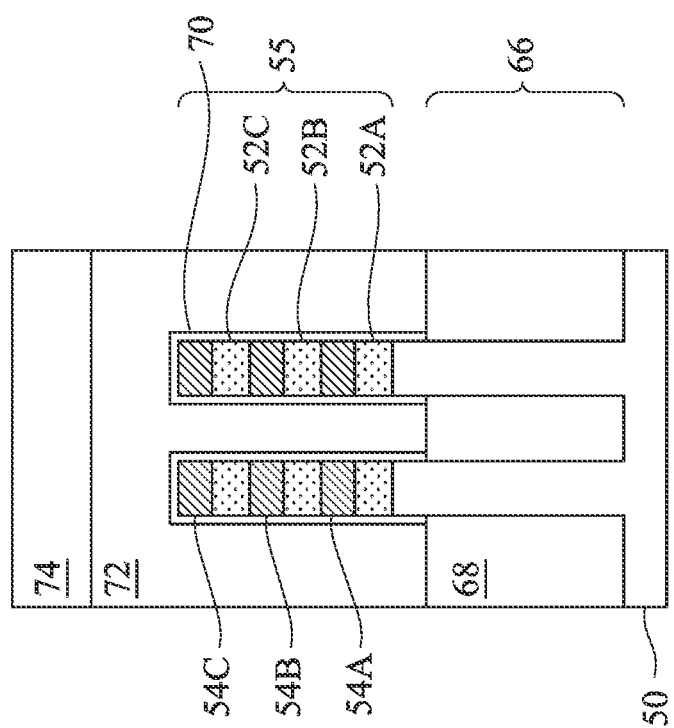

In FIG. 5, a dummy dielectric layer 70 is formed on the fins 66 and/or the nanostructures 55. The dummy dielectric layer 70 may be, for example, silicon oxide, silicon nitride, a combination thereof, or the like, and may be deposited or thermally grown according to acceptable techniques. A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The mask layer 74 may be deposited over the dummy gate layer 72. The dummy gate layer 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching of isolation regions. The mask layer 74 may include, for example, silicon nitride, silicon oxynitride, or the like. A single dummy gate layer 72 and a single mask layer 74 may be formed across the n-type region and the p-type region. It is noted that the dummy dielectric layer 70 is shown covering only the fins 66 and the nanostructures 55 for illustrative purposes only. In some embodiments, the dummy dielectric layer 70 may be deposited such that the dummy dielectric layer 70 covers the STI regions 68, such that the dummy dielectric layer 70 extends between the dummy gate layer 72 and the STI regions 68.

Figure 6A:
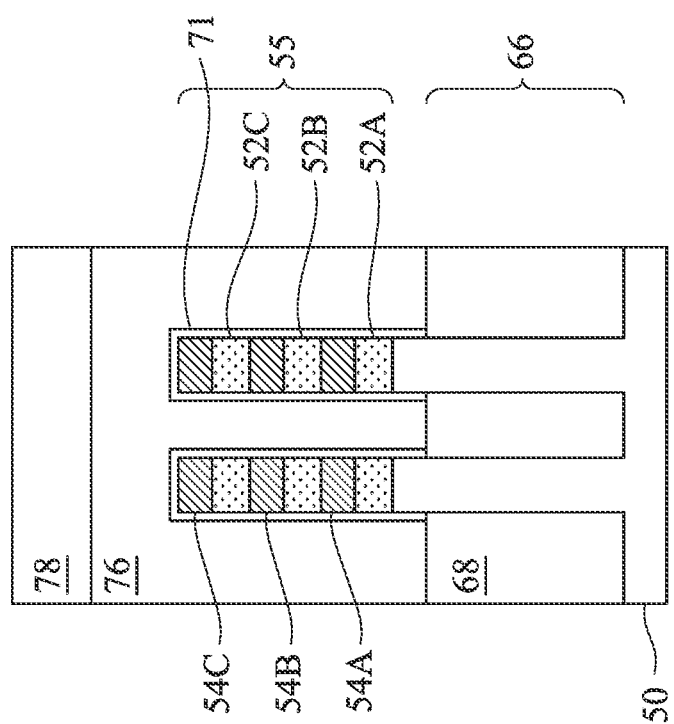
Figure 6B:
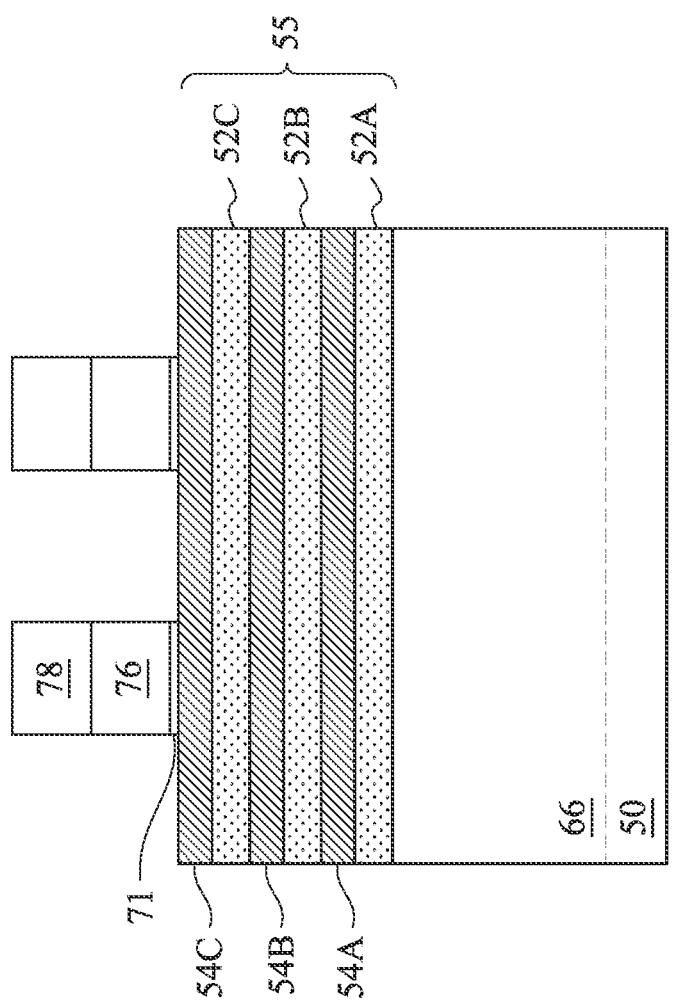

FIGS. 6A through 24B illustrate various additional steps in the manufacturing of embodiment devices. In FIGS. 6A and 6B, the mask layer 74 (see FIG. 5) may be patterned using acceptable photolithography and etching techniques to form masks 78. The pattern of the masks 78 then may be transferred to the dummy gate layer 72 and to the dummy dielectric layer 70 to form dummy gates 76 and dummy gate dielectrics 71, respectively. The dummy gates 76 cover respective channel regions of the fins 66. The pattern of the masks 78 may be used to physically separate each of the dummy gates 76 from adjacent dummy gates 76. The dummy gates 76 may also have a lengthwise direction substantially perpendicular to the lengthwise direction of respective fins 66.

Figure 7B:
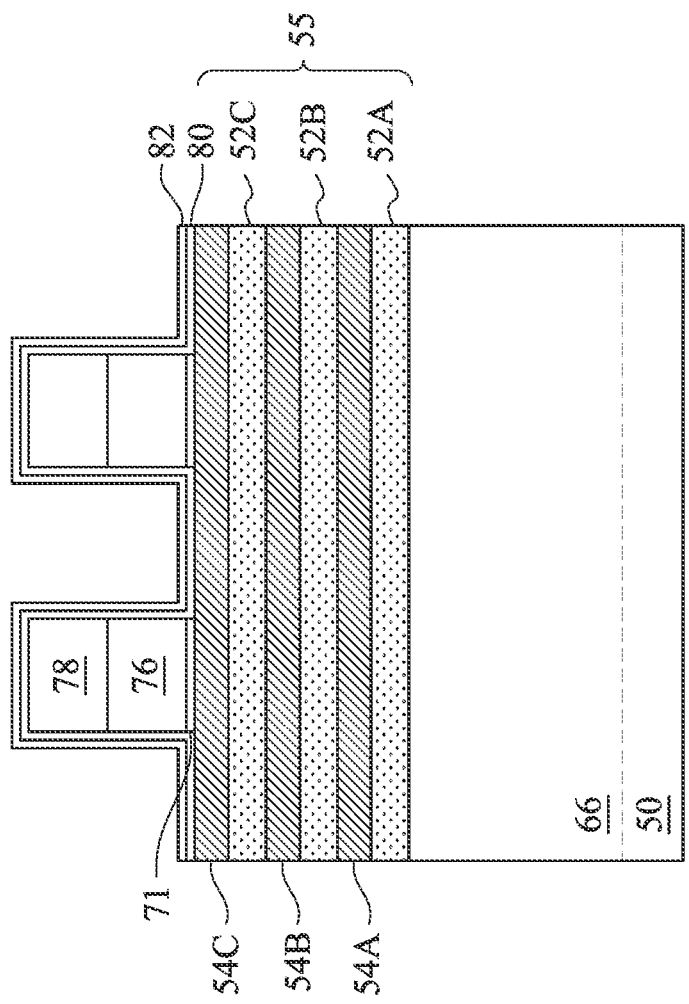
Figure 7A:
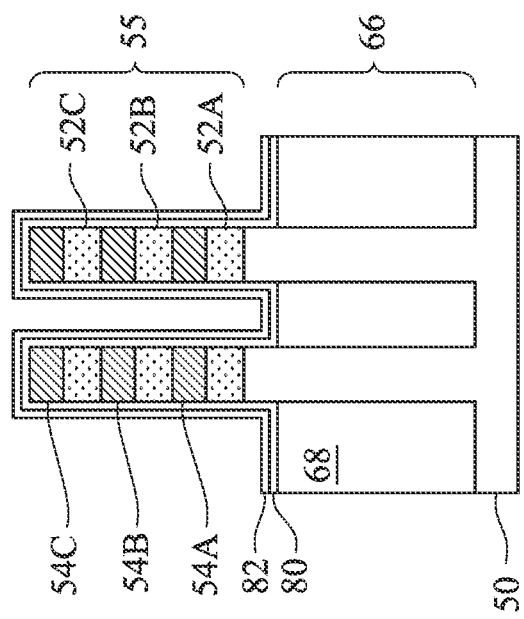

In FIGS. 7A and 7B, a first spacer layer 80 and a second spacer layer 82 are formed over the structures illustrated in FIGS. 6A and 6B, respectively. The first spacer layer 80 and the second spacer layer 82 will be subsequently patterned to act as spacers for forming self-aligned source/drain regions. In FIGS. 7A and 7B, the first spacer layer 80 is formed on top surfaces of the STI regions 68; top surfaces and sidewalls of the fins 66, the nanostructures 55, and the masks 78; and sidewalls of the dummy gates 76 and the dummy gate dielectric 71. The second spacer layer 82 is deposited over the first spacer layer 80. The first spacer layer 80 may be formed of silicon oxide, silicon nitride, silicon oxynitride, or the like, using techniques such as thermal oxidation or deposited by CVD, ALD, or the like. The second spacer layer 82 may be formed of a material having a different etch rate than the material of the first spacer layer 80, such as silicon oxide, silicon nitride, silicon oxynitride, or the like, and may be deposited by CVD, ALD, or the like.

After the first spacer layer 80 is formed and prior to forming the second spacer layer 82, implants for lightly doped source/drain (LDD) regions (not separately illustrated) may be performed. In embodiments with different device types, similar to the implants discussed above in FIG. 4, a mask, such as a photoresist, may be formed over the n-type region, while exposing the p-type region, and appropriate type (e.g., p-type) impurities may be implanted into the exposed fins 66 and nanostructures 55 in the p-type region. The mask may then be removed. Subsequently, a mask, such as a photoresist, may be formed over the p-type region while exposing the n-type region, and appropriate type impurities (e.g., n-type) may be implanted into the exposed fins 66 and nanostructures 55 in the n-type region. The mask may then be removed. The n-type impurities may be the any of the n-type impurities previously discussed, and the p-type impurities may be the any of the p-type impurities previously discussed. The lightly doped source/drain regions may have a concentration of impurities in a range from about $1 \times 10^{15}$ atoms/cm$^3$ to about $1 \times 10^{19}$ atoms/cm$^3$. An annealing process may be used to repair implant damage and to activate the implanted impurities.

Figure 8B:
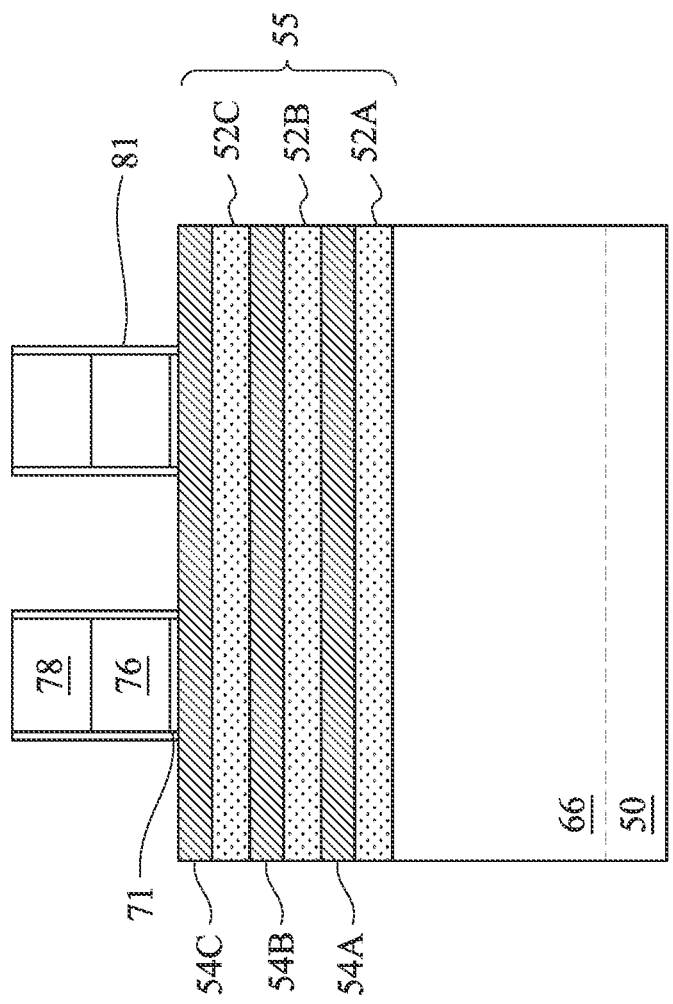
Figure 8A:
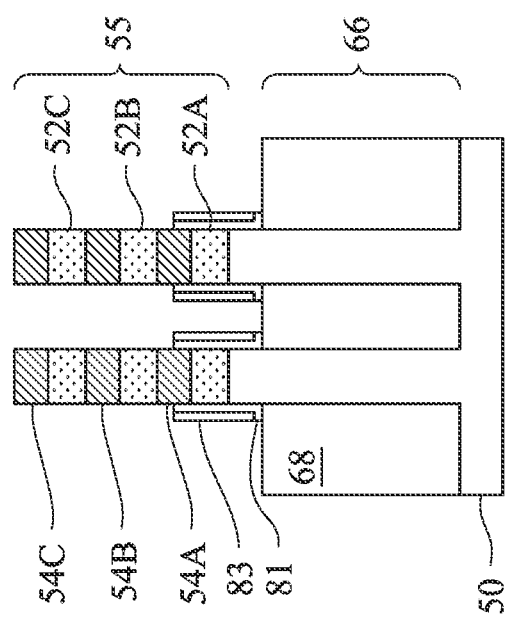

In FIGS. 8A and 8B, the first spacer layer 80 and the second spacer layer 82 are etched to form first spacers 81 and second spacers 83. As will be discussed in greater detail below, the first spacers 81 and the second spacers 83 act to self-aligned subsequently formed source drain regions, as well as to protect sidewalls of the fins 66 and/or nanostructure 55 during subsequent processing. The first spacer layer 80 and the second spacer layer 82 may be etched using a suitable etching process, such as an isotropic etching process (e.g., a wet etching process), an anisotropic etching process (e.g., a dry etching process), or the like. In some embodiments, the material of the second spacer layer 82 has a different etch rate than the material of the first spacer layer 80, such that the first spacer layer 80 may act as an etch stop layer when patterning the second spacer layer 82 and such that the second spacer layer 82 may act as a mask when patterning the first spacer layer 80. For example, the second spacer layer 82 may be etched using an anisotropic etch process wherein the first spacer layer 80 acts as an etch stop layer, wherein remaining portions of the second spacer layer 82 form second spacers 83 as illustrated in FIG. 8A. Thereafter, the second spacers 83 acts as a mask while etching exposed portions of the first spacer layer 80, thereby forming first spacers 81 as illustrated in FIG. 8A.

As illustrated in FIG. 8A, the first spacers 81 and the second spacers 83 are disposed on sidewalls of the fins 66 and/or nanostructures 55. As illustrated in FIG. 8B, in some embodiments, the second spacer layer 82 may be removed from over the first spacer layer 80 adjacent the masks 78, the dummy gates 76, and the dummy gate dielectrics 71, and the first spacers 81 are disposed on sidewalls of the masks 78, the dummy gates 76, and the dummy dielectric layers 60. In other embodiments, a portion of the second spacer layer 82 may remain over the first spacer layer 80 adjacent the masks 78, the dummy gates 76, and the dummy gate dielectrics 71.

It is noted that the above disclosure generally describes a process of forming spacers and LDD regions. Other processes and sequences may be used. For example, fewer or additional spacers may be utilized, different sequence of steps may be utilized (e.g., the first spacers 81 may be patterned prior to depositing the second spacer layer 82), additional spacers may be formed and removed, and/or the like. Furthermore, the n-type and p-type devices may be formed using different structures and steps.

Figure 9B:
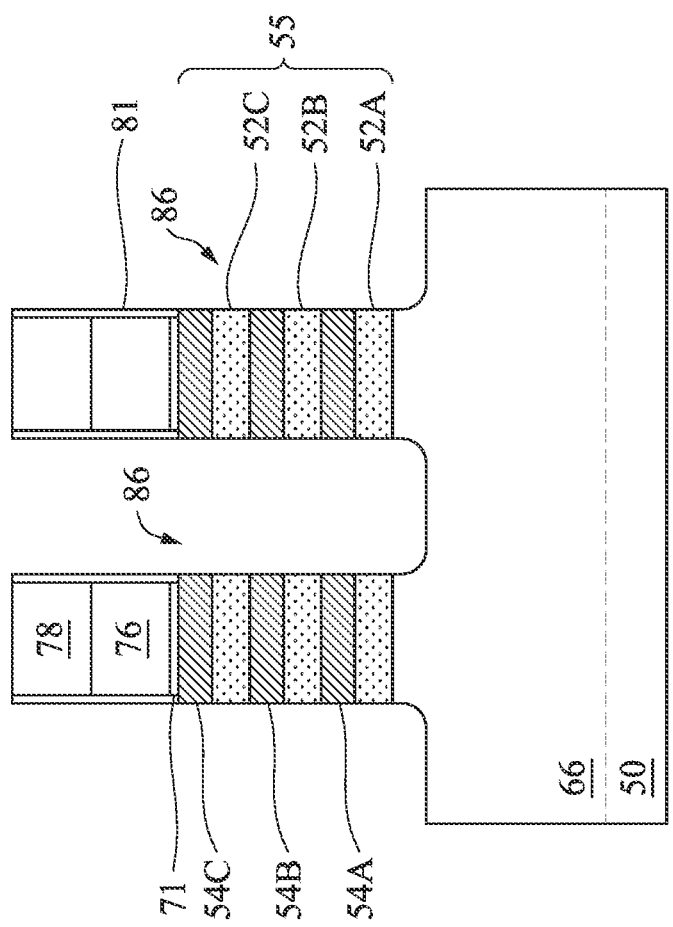
Figure 9A:
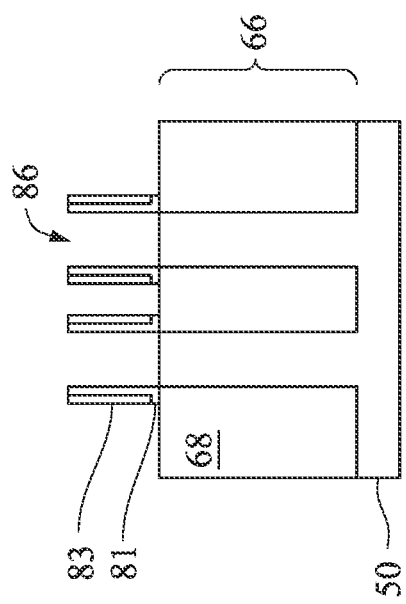

In FIGS. 9A and 9B, first recesses 86 are formed in the fins 66, the nanostructures 55, and the substrate 50, in accordance with some embodiments. Epitaxial source/drain regions will be subsequently formed in the first recesses 86. The first recesses 86 may extend through the first nanostructures 52 and the second nanostructures 54, and into the substrate 50. As illustrated in FIG. 9A, top surfaces of the STI regions 68 may be level with bottom surfaces of the first recesses 86. In various embodiments, the fins 66 may be etched such that bottom surfaces of the first recesses 86 are disposed below the top surfaces of the STI regions 68; or the like. The first recesses 86 may be formed by etching the fins 66, the nanostructures 55, and the substrate 50 using anisotropic etching processes, such as RIE, NBE, or the like. The first spacers 81, the second spacers 83, and the masks 78 mask portions of the fins 66, the nanostructures 55, and the substrate 50 during the etching processes used to form the first recesses 86. A single etch process or multiple etch processes may be used to etch each layer of the nanostructures 55 and/or the fins 66. Timed etch processes may be used to stop the etching of the first recesses 86 after the first recesses 86 reach a desired depth.

Figure 10B:
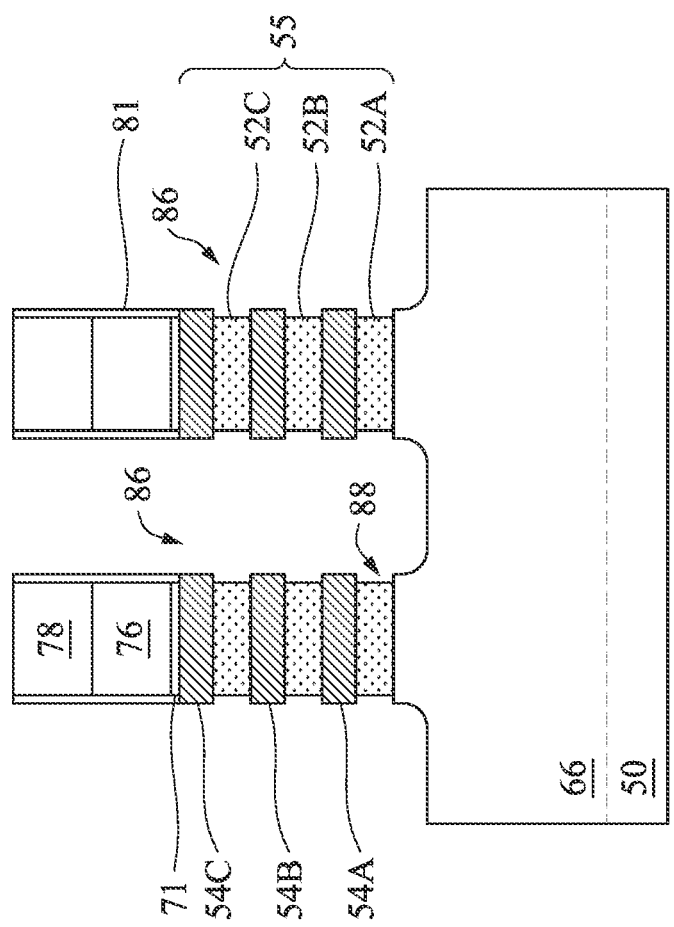
Figure 10A:
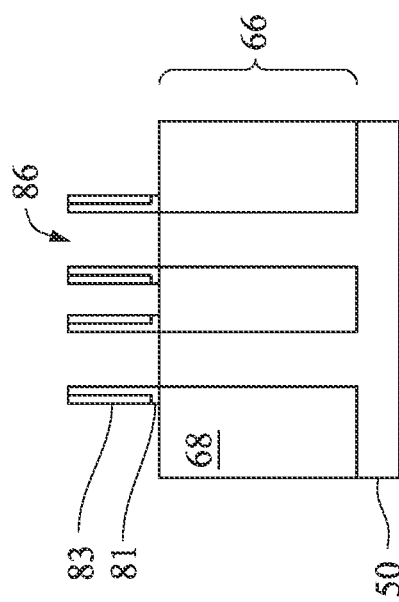

In FIGS. 10A and 10B, portions of sidewalls of the layers of the multi-layer stack 64 formed of the first semiconductor materials (e.g., the first nanostructures 52) exposed by the first recesses 86 are etched to form sidewall recesses 88. Although sidewalls of the first nanostructures 52 and the second nanostructures 54 in sidewall recesses 88 are illustrated as being straight in FIG. 10B, the sidewalls may be concave or convex. The sidewalls may be etched using isotropic etching processes, such as wet etching or the like. In an embodiment in which the first nanostructures 52 include, e.g., SiGe, and the second nanostructures 54 include, e.g., Si or SiC, a dry etch process with tetramethylammonium hydroxide (TMAH), ammonium hydroxide (NH$_4$OH), or the like may be used to etch sidewalls of the first nanostructures 52.

Figure 11B:
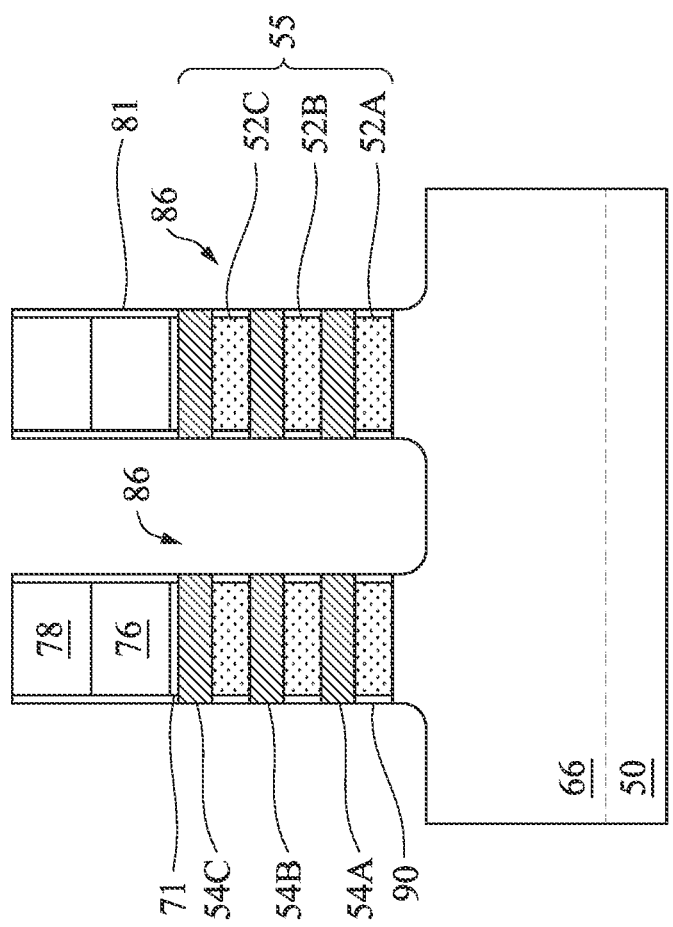
Figure 11A:
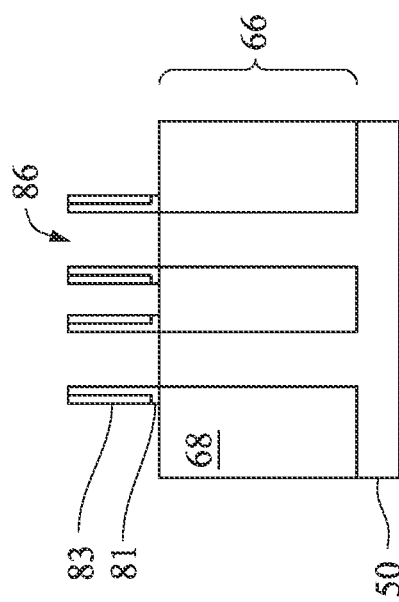
Figure 11C:
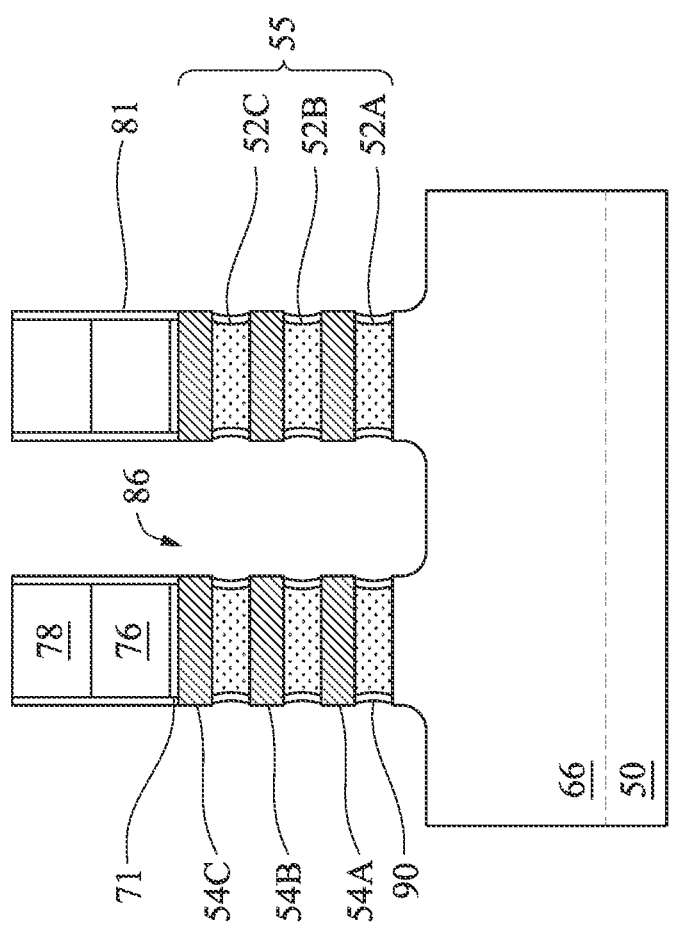

In FIGS. 11A-11C, first inner spacers 90 are formed in the sidewall recess 88. The first inner spacers 90 may be formed by depositing an inner spacer layer (not separately illustrated) over the structures illustrated in FIGS. 10A and 10B. The first inner spacers 90 act as isolation features between subsequently formed source/drain regions and a gate structure. As will be discussed in greater detail below, source/drain regions will be formed in the first recesses 86, while the first nanostructures 52 will be replaced with corresponding gate structures.

The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be anisotropically etched to form the first inner spacers 90. Although outer sidewalls of the first inner spacers 90 are illustrated as being flush with sidewalls of the second nanostructures 54 in the outer sidewalls of the first inner spacers 90 may extend beyond or be recessed from sidewalls of the second nanostructures 54.

Moreover, although the outer sidewalls of the first inner spacers 90 are illustrated as being straight in FIG. 11B, the outer sidewalls of the first inner spacers 90 may be concave or convex. As an example, FIG. 11C illustrates an embodiment in which sidewalls of the first nanostructures 52 are concave, outer sidewalls of the first inner spacers 90 are concave, and the first inner spacers 90 are recessed from sidewalls of the second nanostructures 54. The inner spacer layer may be etched by an anisotropic etching process, such as RIE, NBE, or the like. The first inner spacers 90 may be used to prevent damage to subsequently formed epitaxial source/drain regions 92, discussed below with respect to FIGS. 13A-13D, by subsequent etching processes, such as etching processes used to form gate structures.

Figure 12B:
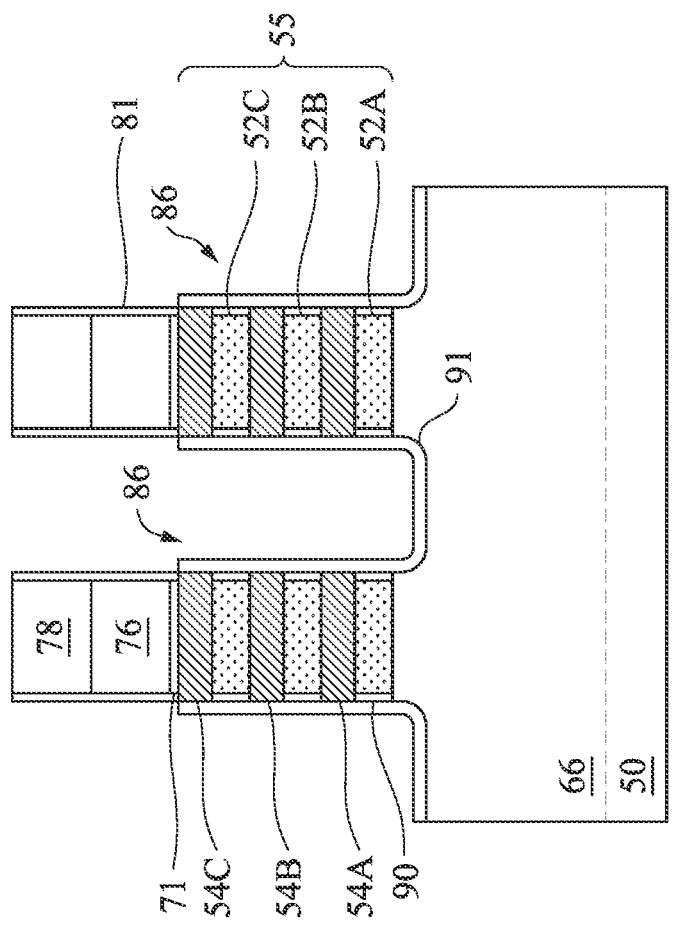
Figure 12A:
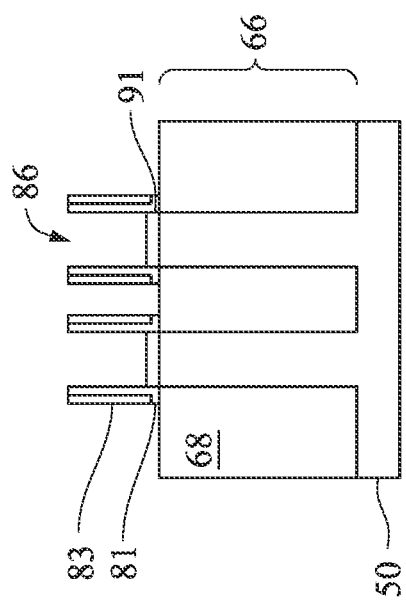
Figure 12C:
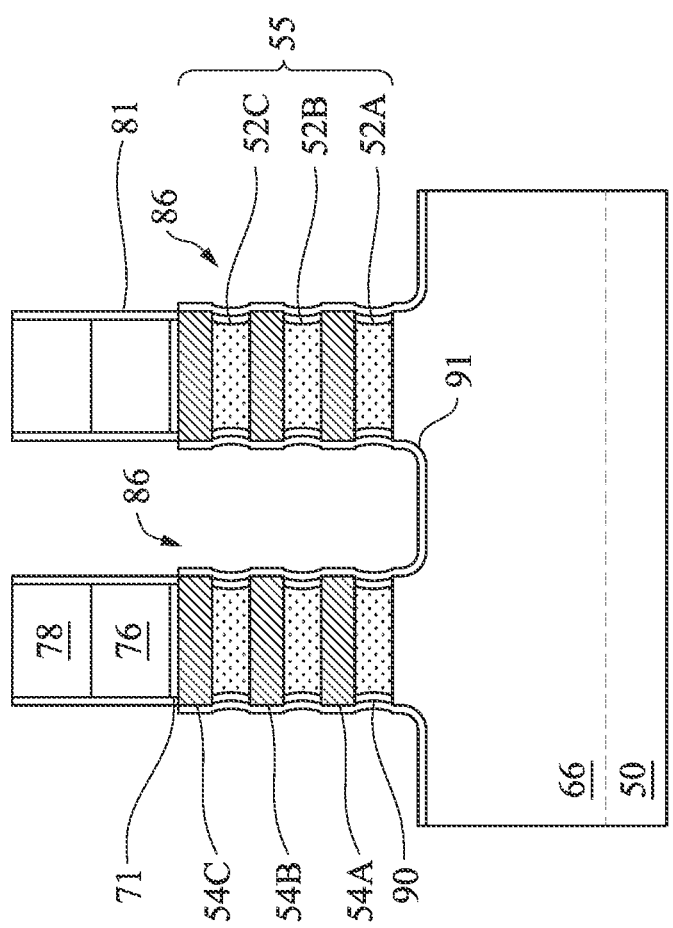

In FIGS. 12A-12C, seeding layers 91 are formed in the first recesses 86. As discussed in greater detail below, epitaxial source/drain regions 92 (shown in FIGS. 13A-13B) will be formed over the seeding layers 91, wherein the seeding layers 91 provide nucleation sites for the epitaxial source/drain regions 92 during the growing process. The seeding layers 91 and the epitaxial source/drain regions 92 may collectively be referred to as source/drain regions 93 (shown in FIGS. 13A-13B). The seeding layers 91 may be formed of any acceptable material. For example, if the second nanostructures 54 are silicon in the n-type region, the seeding layers 91 may include materials exerting a tensile strain on the second nanostructures 54, such as silicon, phosphorus doped silicon, arsenic doped silicon, phosphorus doped silicon carbide, silicon carbide, silicon phosphide, or the like. The seeding layers 91 may be formed using techniques such as CVD or the like, using silane gas and hydrogen gas as precursors to form un-doped silicon. Phosphine gas may be added as a precursor to form phosphorus doped silicon, and arsine gas may be added as a precursor to form arsenic doped silicon. The doping concentration may be greater than zero and less than $5 \times 10^{19}$ atoms/cm$^3$ in the seeding layers 91 that are doped. The deposition may be performed at a temperature in a range from about 400° C. to about 600° C., such as from about 500° C. to about 600° C., and a pressure in a range from about 1 Torr to about 200 Torr, such as from about 100 Torr to about 200 Torr. The deposition time may be in a range from about 30 seconds to about 100 seconds. Although the embodiments above describe in situ doping during deposition, other doping methods, such as ion implantation, may be used instead of or in combination with in situ doping. In some embodiments, the seeding layers 91 may be an un-doped semiconductor material, such as un-doped silicon.

The seeding layers 91 are formed as an amorphous layer during deposition, and an annealing process may be performed to induce crystallization afterwards. The crystallization of the seeding layers 91 promulgates from the second nanostructures 54 and the substrate 50. The annealing process may be performed in a hydrogen environment at a temperature in range from about 600° C. to about 700° C. for a duration in range from about 100 s to about 300 s.

The seeding layers 91 may be completely or partially crystallized in the first recesses 86. As discussed above, the crystallization promulgates from the second nanostructures 54 and the substrate 50. In embodiments in which the annealing is performed for a sufficient duration, the crystallization may promulgate for the entire thickness of the seeding layer 91 and promulgate over the first inner spacers 90. Accordingly, the portions of the seeding layers 91 that cover surfaces of the first recesses 86 may become polycrystalline or monocrystalline after annealing, while portions of the seeding layers 91 that are adjacent the first spacers 81 and over the masks 78 may remain amorphous after annealing. An etching process may be performed to remove the amorphous portions of the seeding layers 91 adjacent the first spacers 81 and over the masks 78, leaving crystallized portions the seeding layers 91 in the first recesses 86. The etching process may be a wet etching, such as a wet etch using hydrochloric acid at a temperature in a range from about 600° C. to about 700° C.

In some embodiments, as shown in FIG. 12B, the seeding layers 91 may be continuous U-shaped layers, with sidewalls covering sidewalls of the second nanostructures 54 and the sidewalls of the first inner spacers 90. The seeding layers 91 may have a thickness in a range from about 0.5 nm to about 3 nm. Bottom portions of the seeding layers 91 may be in direct contact with the substrate 50. In some embodiments, as shown in FIG. 12C, portions of the seeding layers formed on the concave outer sidewalls of the first inner spacers 90 may also be concave.

Forming the seeding layers 91 as, for example, an amorphous material such as amorphous silicon allows the formation of the seeding layers 91 over an entire surface of the substrate, including over the sidewalls of the first inner spacers 90. The subsequent crystallization provides a more even surface upon which the subsequent epitaxial source/drain regions 92 may be epitaxially grown, thereby reducing voids and stacking faults.

Figure 13B:
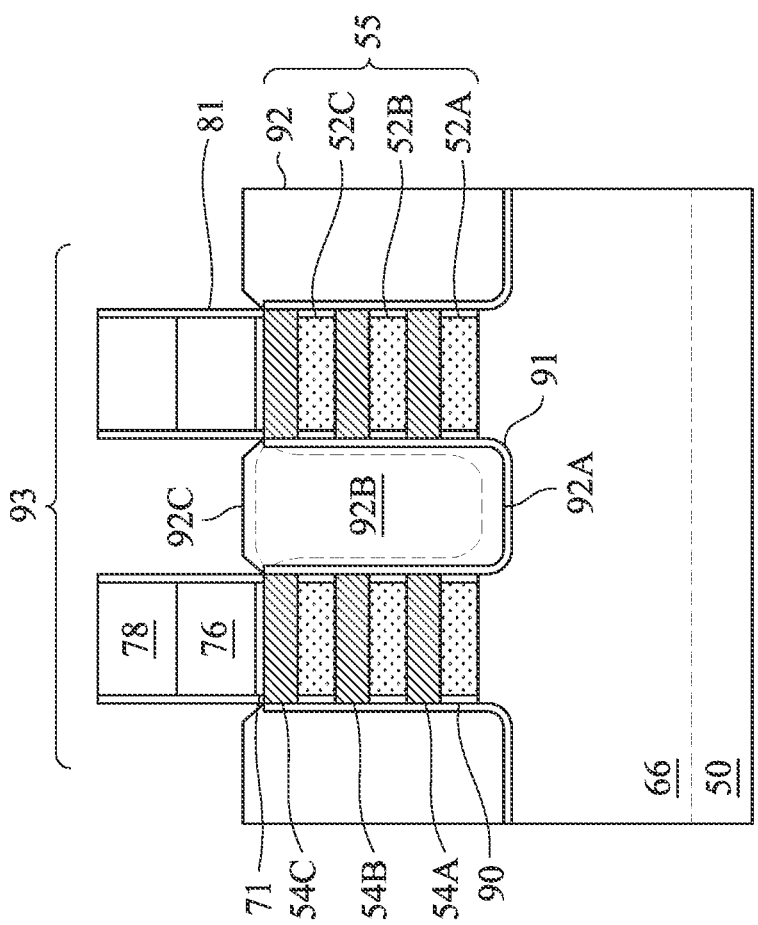
Figure 13A:
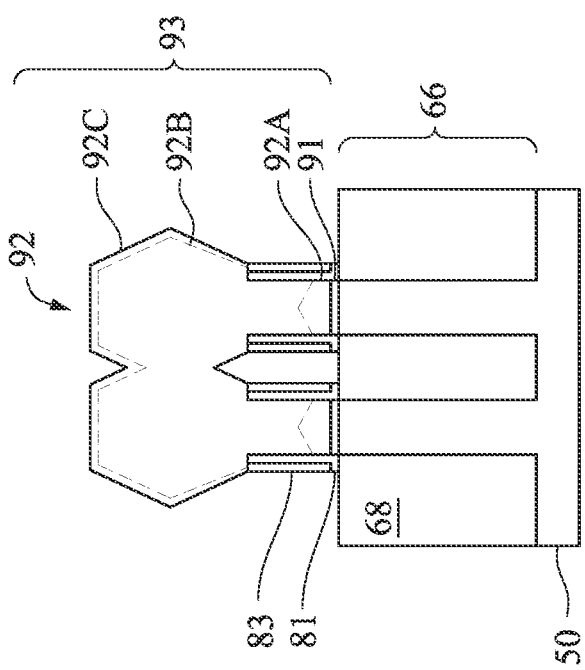
Figure 13D:
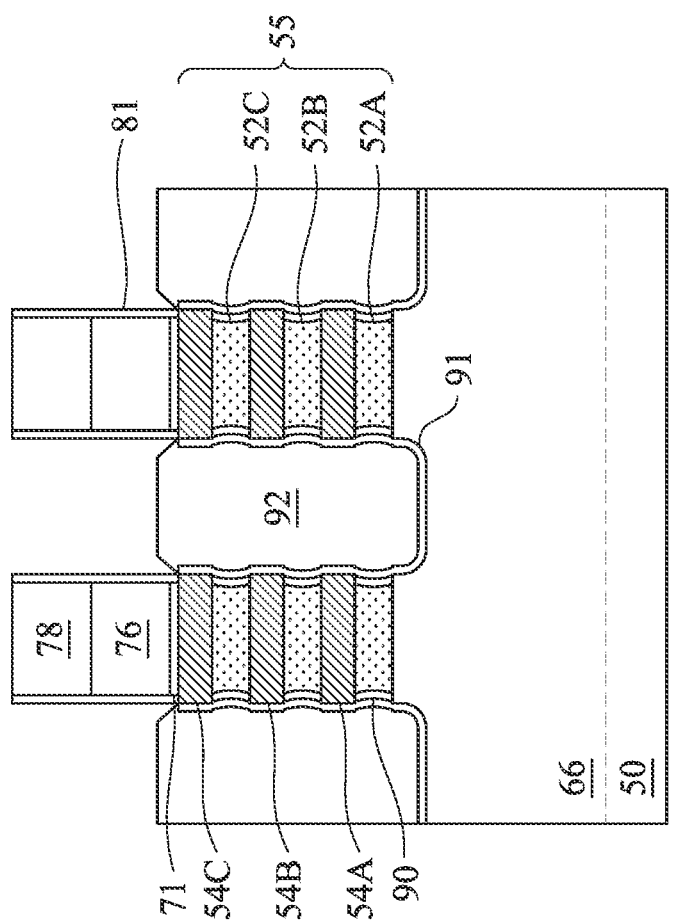
Figure 13C:
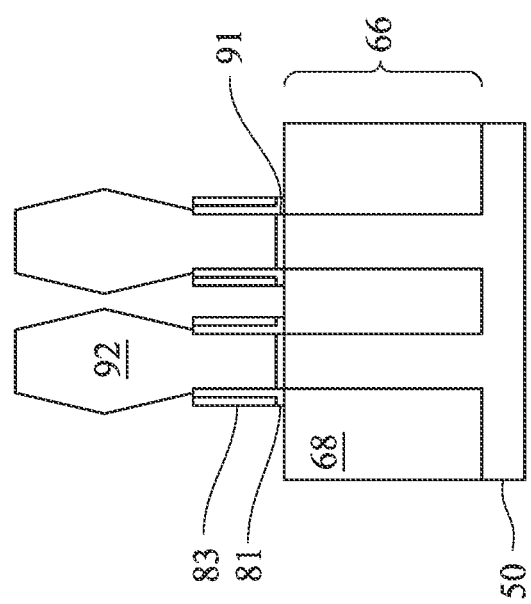

In FIGS. 13A-13C, the epitaxial source/drain regions 92 are formed on the seeding layers 91 in the first recesses 86. In some embodiments, the epitaxial source/drain regions 92 may exert stress on the second nanostructures 54, thereby improving performance. As illustrated in FIG. 13B, the epitaxial source/drain regions 92 are formed in the first recesses 86 such that each dummy gate 76 is disposed between respective neighboring pairs of the epitaxial source/drain regions 92. In some embodiments, the first spacers 81 are used to separate the epitaxial source/drain regions 92 from the dummy gates 76 and the first inner spacers 90 are used to separate the seeding layers 91 as well as the epitaxial source/drain regions 92 from the nanostructures 55 by an appropriate lateral distance so that the epitaxial source/drain regions 92 do not short out with subsequently formed gates of the resulting nano-FETs.

The epitaxial source/drain regions 92 may include any acceptable material appropriate for the epitaxial source/drain regions 92. For example, if the second nanostructures 54 are silicon for the n-type region, the epitaxial source/drain regions 92 may include materials exerting a tensile strain on the second nanostructures 54, such as silicon, phosphorus doped silicon, silicon carbide, phosphorus doped silicon carbide, silicon phosphide, or the like. The epitaxial source/drain regions 92 may have surfaces raised from respective upper surfaces of the nanostructures 55 and may have facets.

In some embodiments, the epitaxial source/drain regions 92 may be in situ doped during growth or implanted after. The source/drain regions may have a doping concentration greater than $2 \times 10^{21}$ atoms/cm$^3$. In some embodiments, the epitaxial source/drain regions 92 may be polycrystalline or monocrystalline after deposition. As discussed previously, by forming the epitaxial source/drain regions 92 over the seeding layers 91, the epitaxial source/drain regions 92 would have increased uniformity and reduced defects, such as voids and stacking faults, due to the more abundant and more evenly distributed nucleation sites the seeding layers 91 provide during the growth of the epitaxial source/drain regions 92.

As a result of the epitaxy processes used to form the epitaxial source/drain regions 92, upper portions of the epitaxial source/drain regions 92 have facets which expand laterally outward beyond sidewalls of the nanostructures 55, while the lateral expansion of bottom portions of the epitaxial source/drain regions 92 are restricted by the first spacers 81. In some embodiments, these facets cause adjacent epitaxial source/drain regions 92 of a same nano-FET to merge as illustrated by FIG. 13A. In other embodiments, adjacent epitaxial source/drain regions 92 remain separated after the epitaxy process is completed as illustrated by FIG. 13C. In some other embodiments, the spacer etch used to form the first spacers 81 may be adjusted to remove the spacer material to allow the epitaxially grown regions to extend to the surface of the STI regions 68.

The epitaxial source/drain regions 92 may comprise one or more semiconductor material layers. For example, the epitaxial source/drain regions 92 may comprise a first semiconductor material layer 92A, a second semiconductor material layer 92B, and a third semiconductor material layer 92C. Any number of semiconductor material layers may be used for the epitaxial source/drain regions 92. Each of the first semiconductor material layer 92A, the second semiconductor material layer 92B, and the third semiconductor material layer 92C may be formed of different semiconductor materials and may be doped to different dopant concentrations. In some embodiments, the first semiconductor material layer 92A may have a dopant concentration less than the second semiconductor material layer 92B and greater than the third semiconductor material layer 92C. In embodiments in which the epitaxial source/drain regions 92 comprise three semiconductor material layers, the first semiconductor material layer 92A may be deposited, the second semiconductor material layer 92B may be deposited over the first semiconductor material layer 92A, and the third semiconductor material layer 92C may be deposited over the second semiconductor material layer 92B.

FIG. 13D illustrates the formation of the epitaxial source/drain regions 92 on the seeding layers 91 and in the first recesses 86 according to the embodiment described above with respect to FIG. 12C. The portions of the epitaxial source/drain regions 92 formed over the concave portions of the seeding layers 91 may be convex.

Figure 14A:
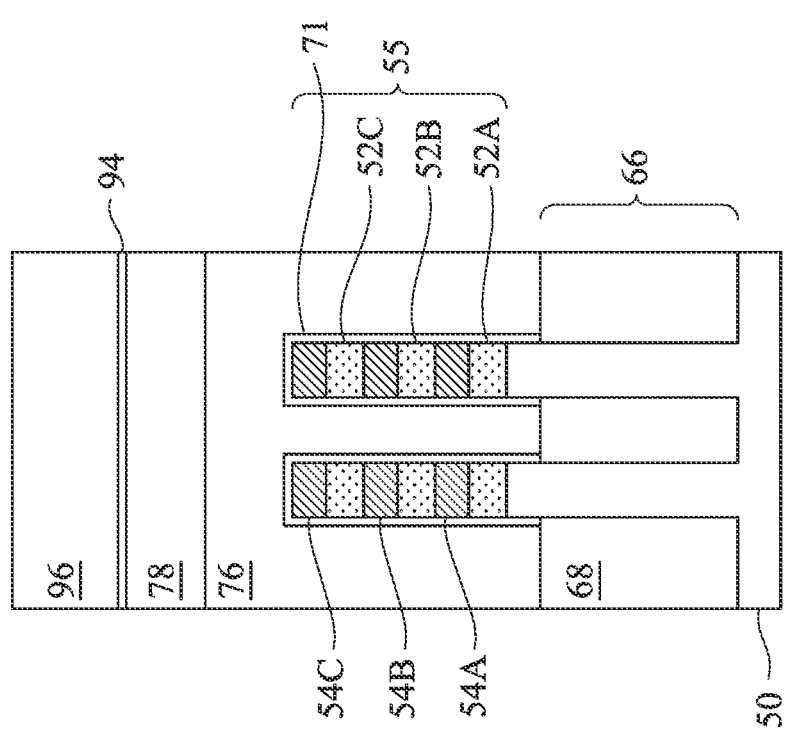
Figure 14B:
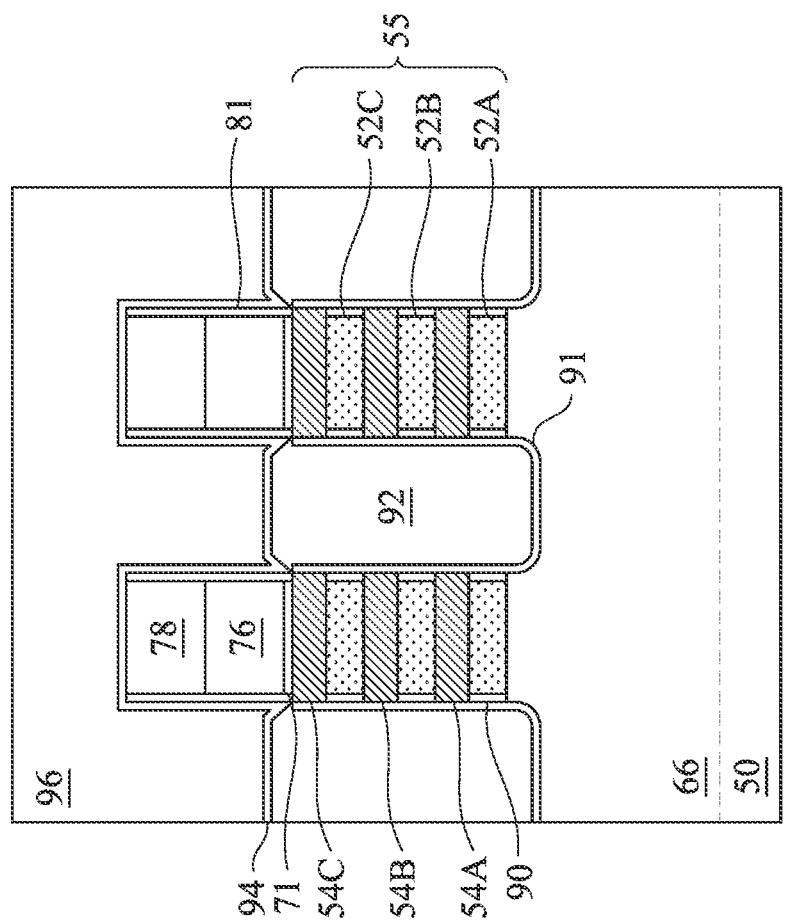
Figure 14C:
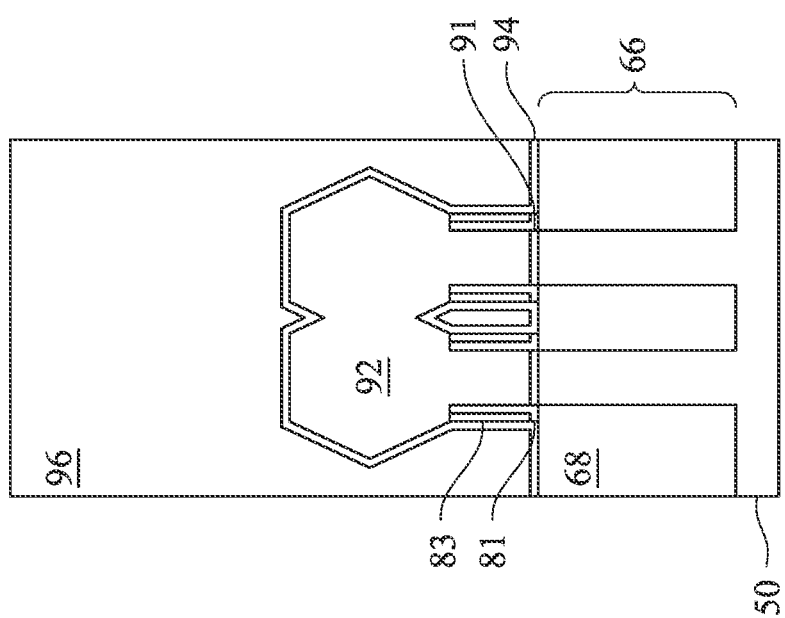

In FIGS. 14A-14C, a first interlayer dielectric (ILD) 96 is deposited over the structure illustrated in FIGS. 6A, 13A, and 13B (the processes of FIGS. 7A-13D do not alter the cross-section illustrated in FIGS. 6A), respectively. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 94 is disposed between the first ILD 96 and the epitaxial source/drain regions 92, the masks 78, and the first spacers 81. The CESL 94 may comprise a dielectric material, such as, silicon nitride, silicon oxide, silicon oxynitride, or the like, having a different etch rate than the material of the overlying first ILD 96.

Figure 15B:
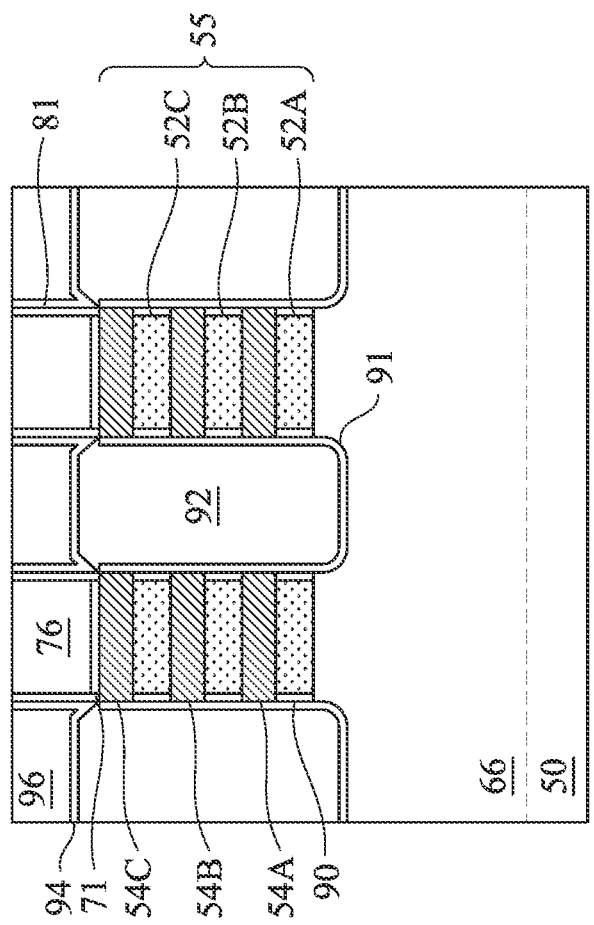
Figure 15A:
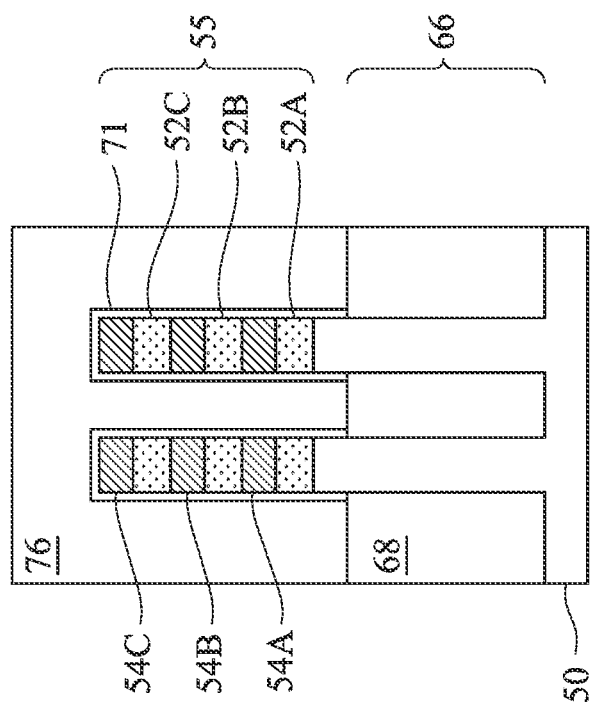

In FIGS. 15A-15B, a planarization process, such as a CMP, may be performed to level the top surface of the first ILD 96 with the top surfaces of the dummy gates 76 or the masks 78. The planarization process may also remove the masks 78 on the dummy gates 76, and portions of the first spacers 81 along sidewalls of the masks 78. After the planarization process, top surfaces of the dummy gates 76, the first spacers 81, and the first ILD 96 are level within process variations. Accordingly, the top surfaces of the dummy gates 76 are exposed through the first ILD 96. In some embodiments, the masks 78 may remain, in which case the planarization process levels the top surface of the first ILD 96 with top surface of the masks 78 and the first spacers 81.

Figure 16B:
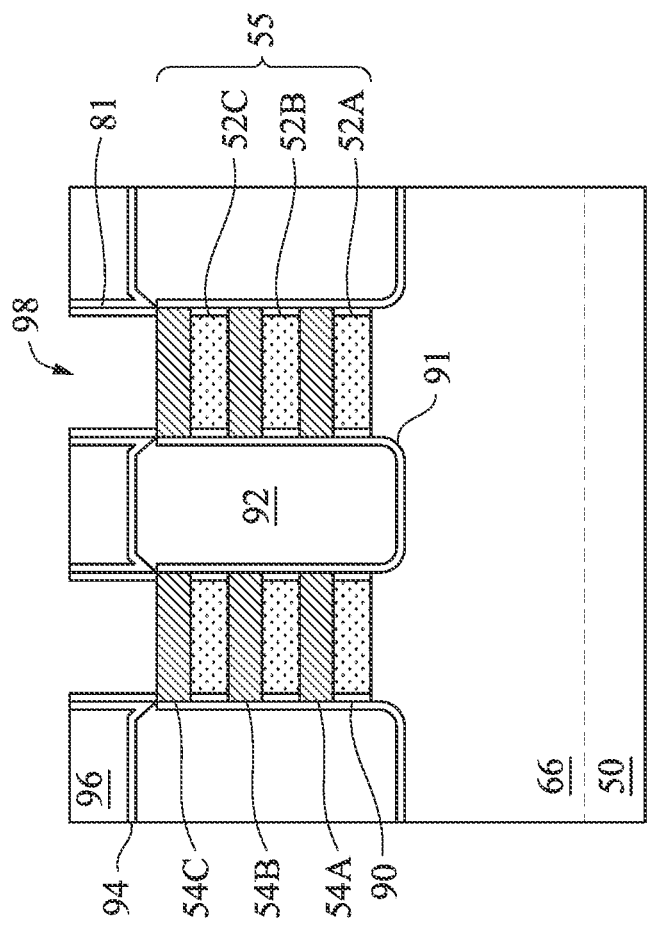
Figure 16A:
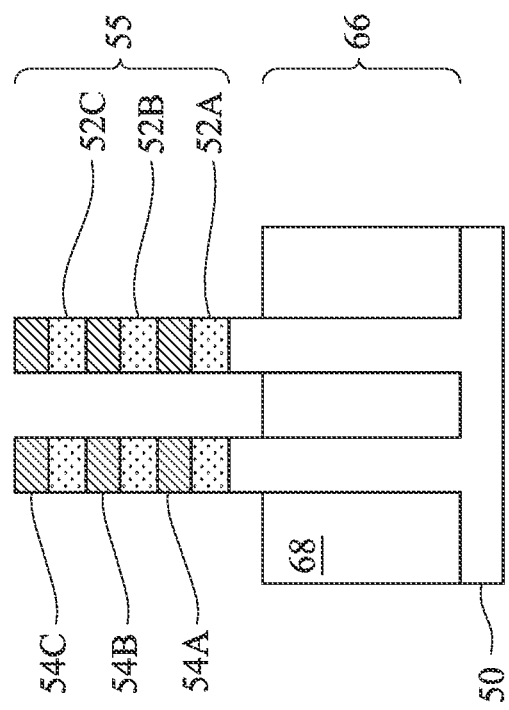

In FIGS. 16A and 16B, the dummy gates 76, and the masks 78 if present, are removed in one or more etching steps, so that second recesses 98 are formed. Portions of the dummy dielectric layers 60 in the second recesses 98 are also be removed. In some embodiments, the dummy gates 76 and the dummy dielectric layers 60 are removed by an anisotropic dry etch process. For example, the etching process may include a dry etch process using reaction gas(es) that selectively etch the dummy gates 76 at a faster rate than the first ILD 96 or the first spacers 81. Each second recess 98 exposes and/or overlies portions of nanostructures 55, which act as channel regions in subsequently completed nano-FETs. Portions of the nanostructures 55 which act as the channel regions are disposed between neighboring pairs of the epitaxial source/drain regions 92. During the removal, the dummy dielectric layers 60 may be used as etch stop layers when the dummy gates 76 are etched. The dummy dielectric layers 60 may then be removed after the removal of the dummy gates 76.

Figure 17B:
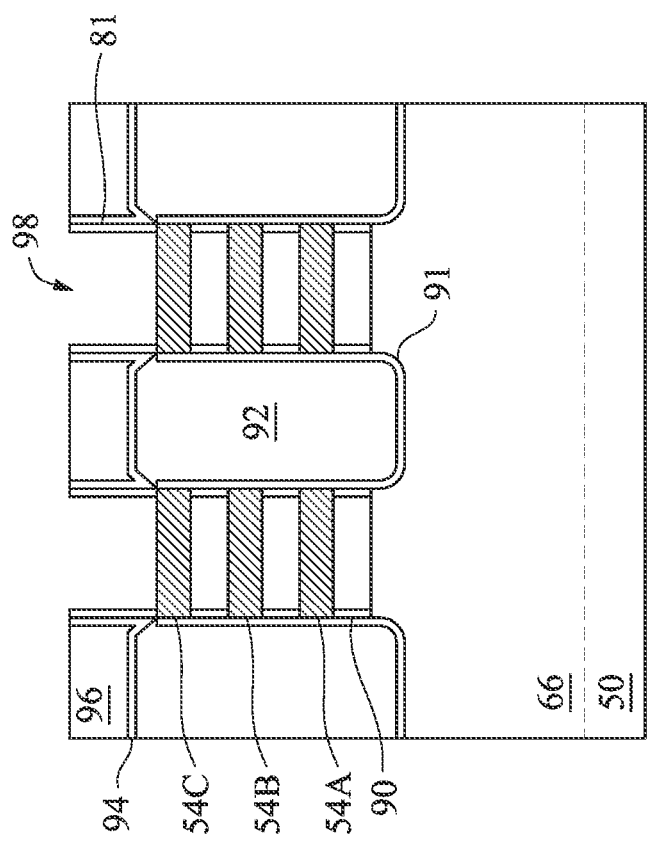
Figure 17A:
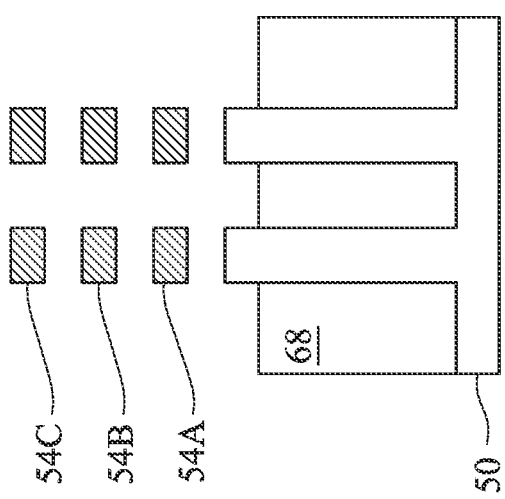

In FIGS. 17A and 17B, the first nanostructures 52 are removed extending the second recesses 98. The first nanostructures 52 may be removed by performing an isotropic etching process such as wet etching or the like using etchants which are selective to the materials of the first nanostructures 52, while the second nanostructures 54, the substrate 50, the STI regions 68 remain relatively unetched as compared to the first nanostructures 52. In embodiments in which the first nanostructures 52 include, e.g., SiGe, and the second nanostructures 54A-54C include, e.g., Si or SiC, tetramethylammonium hydroxide (TMAH), ammonium hydroxide (NH$_4$OH), or the like may be used to remove the first nanostructures 52 in the n-type region.

Figure 18B:
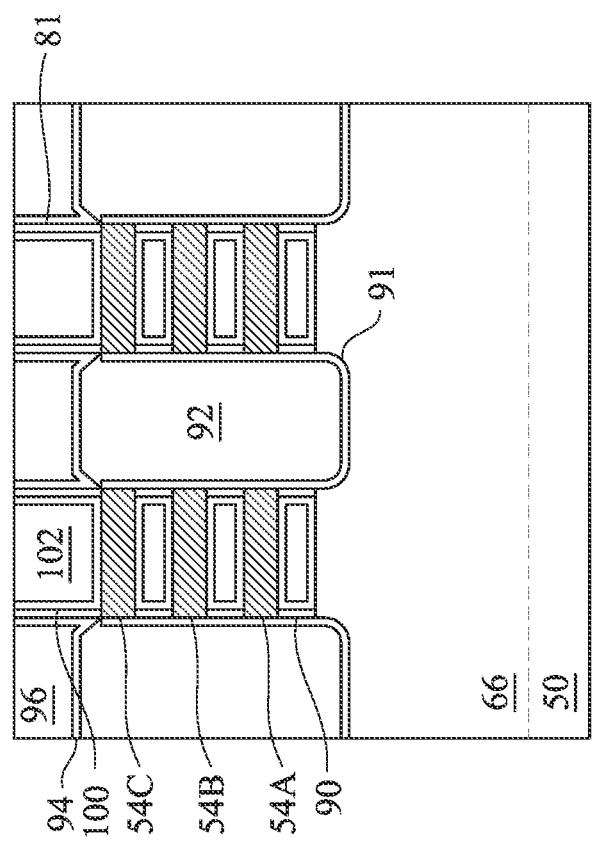
Figure 18A:
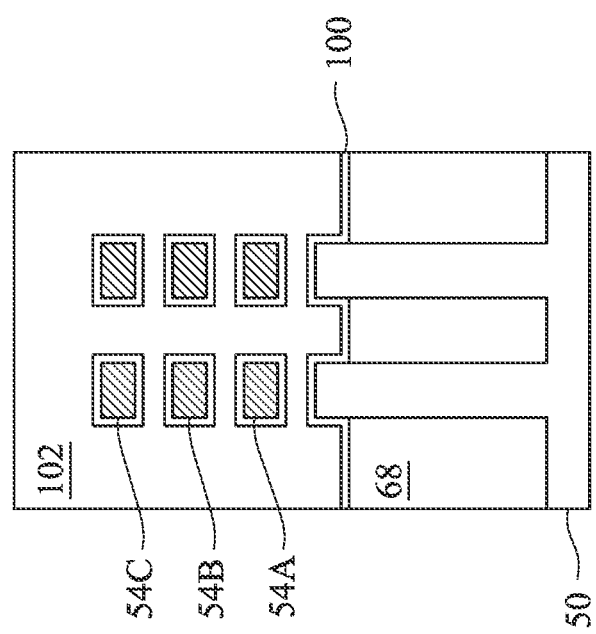

In FIGS. 18A and 18B, gate dielectric layers 100 and gate electrodes 102 are formed for replacement gates. The gate dielectric layers 100 are deposited conformally in the second recesses 98. The gate dielectric layers 100 may be formed on top surfaces and sidewalls of the substrate 50 and on top surfaces, sidewalls, and bottom surfaces of the second nanostructures 54. The gate dielectric layers 100 may also be deposited on top surfaces of the first ILD 96, the CESL 94, the first spacers 81, and the STI regions 68.

In accordance with some embodiments, the gate dielectric layers 100 comprise one or more dielectric layers, such as an oxide, a metal oxide, the like, or combinations thereof. For example, in some embodiments, the gate dielectrics may comprise a silicon oxide layer and a metal oxide layer over the silicon oxide layer. In some embodiments, the gate dielectric layers 100 include a high-k dielectric material, and in these embodiments, the gate dielectric layers 100 may have a k value greater than about 7.0, and may include a metal oxide or a silicate of hafnium, aluminum, zirconium, lanthanum, manganese, barium, titanium, lead, and combinations thereof. The formation methods of the gate dielectric layers 100 may include molecular-beam deposition (MBD), ALD, PECVD, and the like.

The gate electrodes 102 are deposited over the gate dielectric layers 100, respectively, and fill the remaining portions of the second recesses 98. The gate electrodes 102 may include a metal-containing material such as titanium nitride, titanium oxide, tantalum nitride, tantalum carbide, cobalt, ruthenium, aluminum, tungsten, combinations thereof, or multi-layers thereof. For example, although single layer gate electrodes 102 are illustrated in FIGS. 18A and 18B, the gate electrodes 102 may comprise any number of liner layers, any number of work function tuning layers, and a fill material. Any combination of the layers which make up the gate electrodes 102 may be deposited between adjacent ones of the second nanostructures 54.

After the filling of the second recesses 98, a planarization process, such as a CMP, may be performed to remove the excess portions of the gate dielectric layers 100 and the material of the gate electrodes 102, which excess portions are over the top surface of the first ILD 96. The remaining portions of material of the gate electrodes 102 and the gate dielectric layers 100 thus form replacement gate structures of the resulting nano-FETs. The gate electrodes 102 and the gate dielectric layers 100 may be collectively referred to as "gate structures."

Figure 19B:
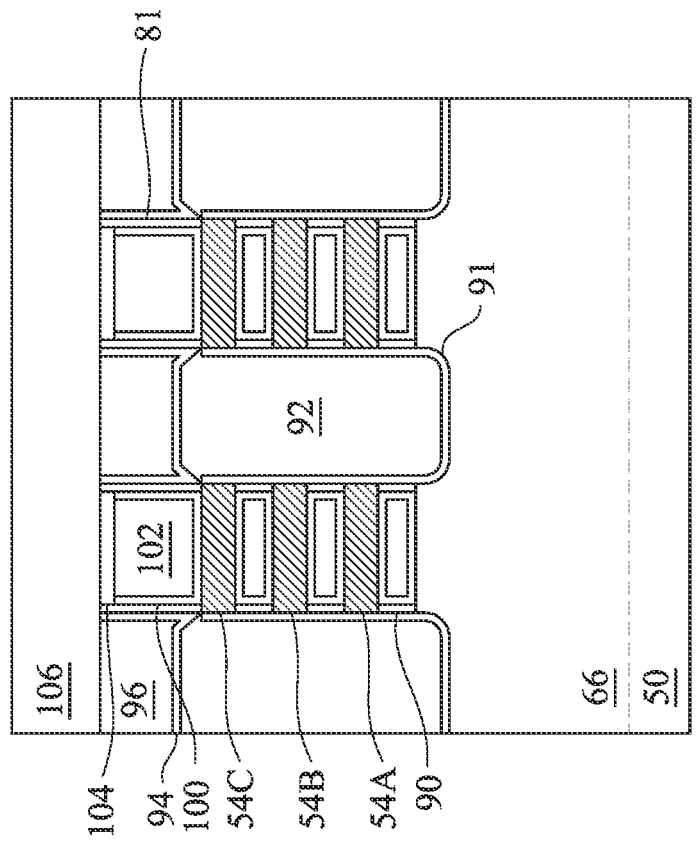
Figure 19A:
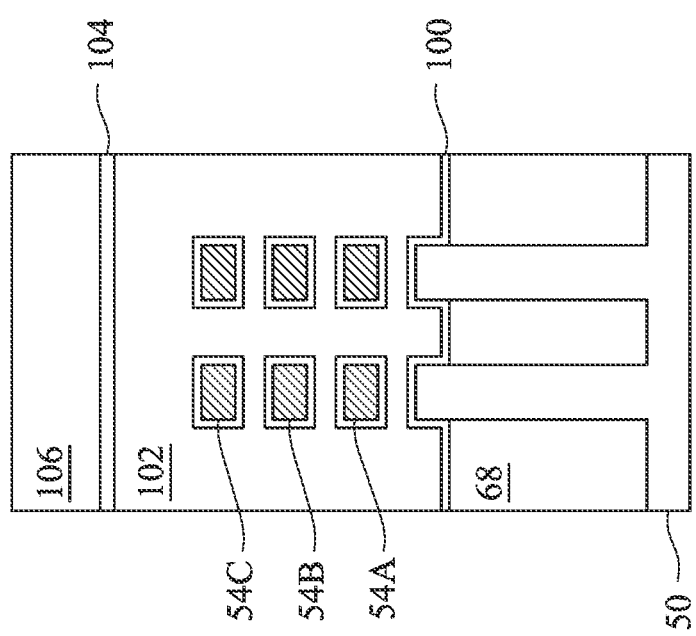
Figure 19C:
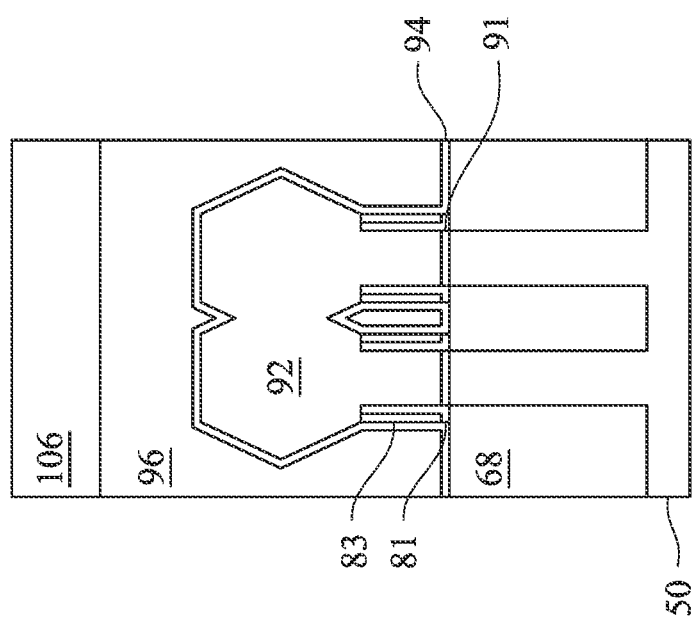

In FIGS. 19A-19C, the gate structure (including the gate dielectric layers 100 and the corresponding overlying gate electrodes 102) is recessed, so that a recess is formed directly over the gate structure and between opposing portions of first spacers 81. A gate mask 104 comprising one or more layers of dielectric material, such as silicon nitride, silicon oxynitride, or the like, is filled in the recess, followed by a planarization process to remove excess portions of the dielectric material extending over the first ILD 96. Subsequently formed gate contacts (such as the contacts 114, discussed below with respect to FIGS. 21A and 21B) penetrate through the gate mask 104 to contact the top surface of the recessed gate electrodes 102.

As further illustrated by FIGS. 19A-19C, a second ILD 106 is deposited over the first ILD 96 and over the gate mask 104. In some embodiments, the second ILD 106 is a flowable film formed by FCVD. In some embodiments, the second ILD 106 is formed of a dielectric material such as PSG, BSG, BPSG, USG, or the like, and may be deposited by any suitable method, such as CVD, PECVD, or the like.

Figure 20B:
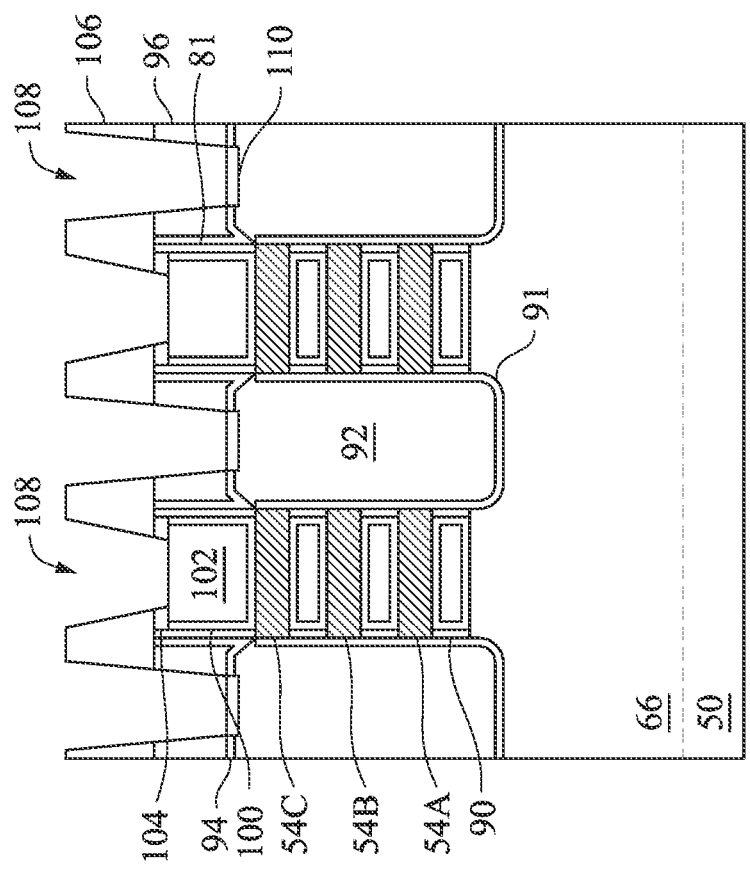
Figure 20A:
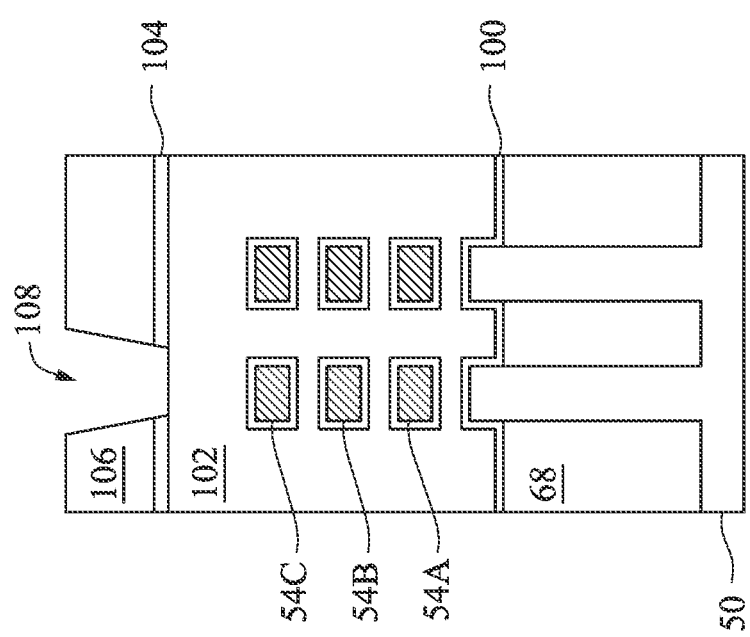
Figure 20C:
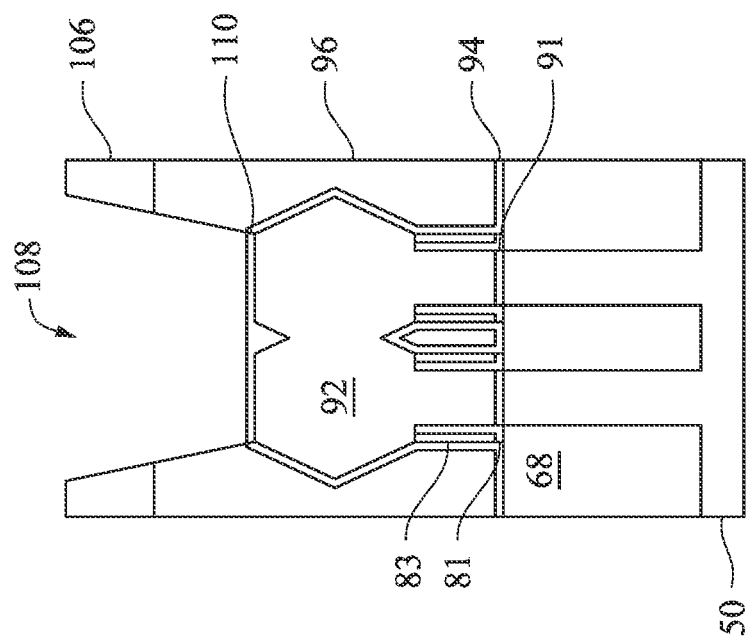

In FIGS. 20A-20C, the second ILD 106, the first ILD 96, the CESL 94, and the gate masks 104 are etched to form third recesses 108 exposing surfaces of the epitaxial source/drain regions 92 and/or the gate structure. The third recesses 108 may be formed by etching using an anisotropic etching process, such as RIE, NBE, or the like. In some embodiments, the third recesses 108 may be etched through the second ILD 106 and the first ILD 96 using a first etching process; may be etched through the gate masks 104 using a second etching process; and may then be etched through the CESL 94 using a third etching process. A mask, such as a photoresist, may be formed and patterned over the second ILD 106 to mask portions of the second ILD 106 from the first etching process and the second etching process. In some embodiments, the etching process may over-etch, and therefore, the third recesses 108 extend into the epitaxial source/drain regions 92 and/or the gate structure, and a bottom of the third recesses 108 may be level with (e.g., at a same level, or having a same distance from the substrate), or lower than (e.g., closer to the substrate) the epitaxial source/drain regions 92 and/or the gate structure. Although FIG. 20B illustrate the third recesses 108 as exposing the epitaxial source/drain regions 92 and the gate structure in a same cross section, in various embodiments, the epitaxial source/drain regions 92 and the gate structure may be exposed in different cross-sections, thereby reducing the risk of shorting subsequently formed contacts. After the third recesses 108 are formed, silicide regions 110 are formed over the epitaxial source/drain regions 92. In some embodiments, the silicide regions 110 are formed by first depositing a metal (not shown) capable of reacting with the semiconductor materials of the underlying epitaxial source/drain regions 92 (e.g., silicon, silicon germanium, germanium) to form silicide or germanide regions, such as nickel, cobalt, titanium, tantalum, platinum, tungsten, other noble metals, other refractory metals, rare earth metals or their alloys, over the exposed portions of the epitaxial source/drain regions 92, then performing a thermal annealing process to form the silicide regions 110. The un-reacted portions of the deposited metal are then removed, e.g., by an etching process. Although silicide regions 110 are referred to as silicide regions, silicide regions 110 may also be germanide regions, or silicon germanide regions (e.g., regions comprising silicide and germanide). In an embodiment, the silicide region 110 comprises TiSi, and has a thickness in a range between about 2 nm and about 10 nm.

Figure 21B:
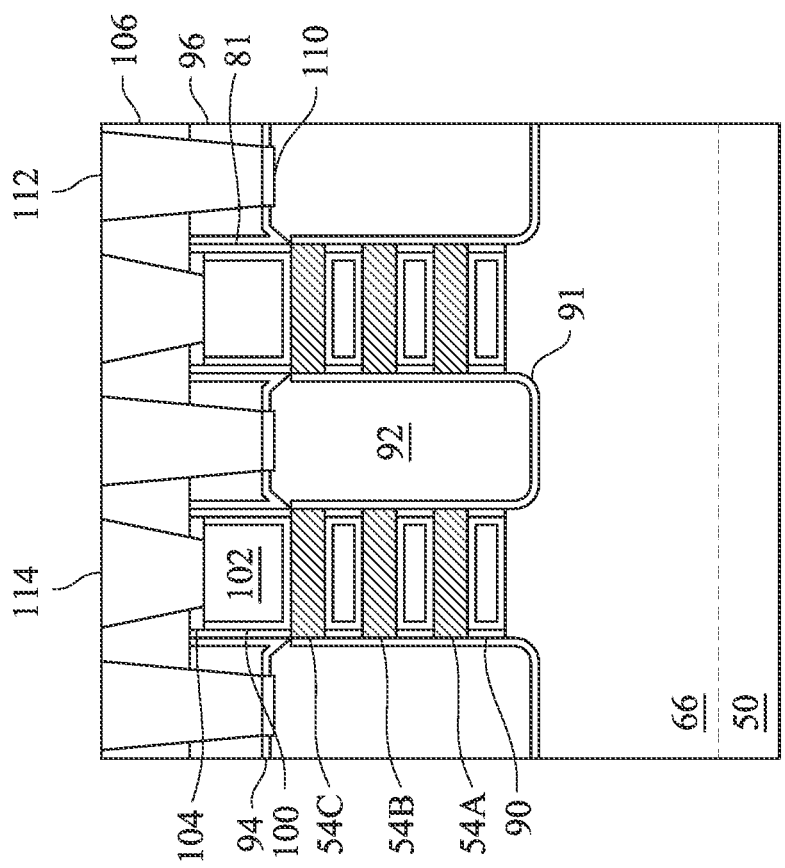
Figure 21A:
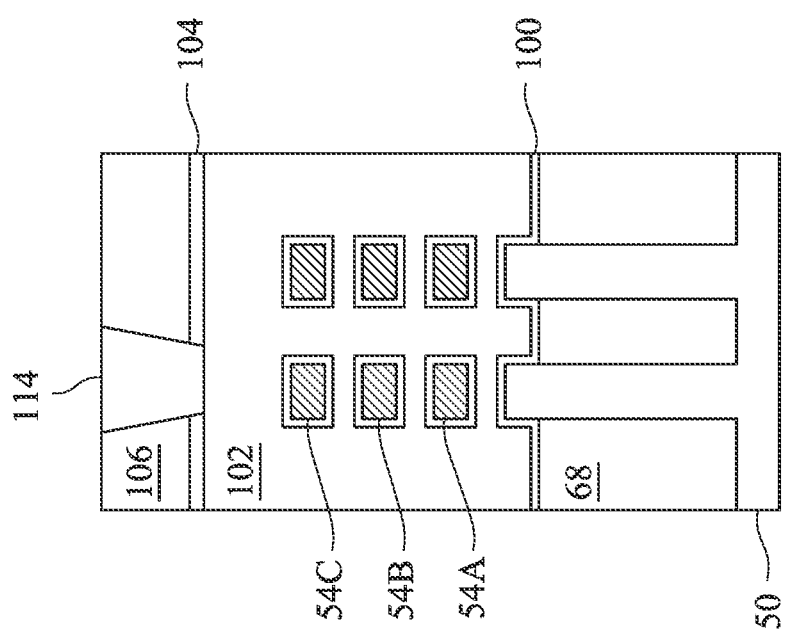
Figure 21C:
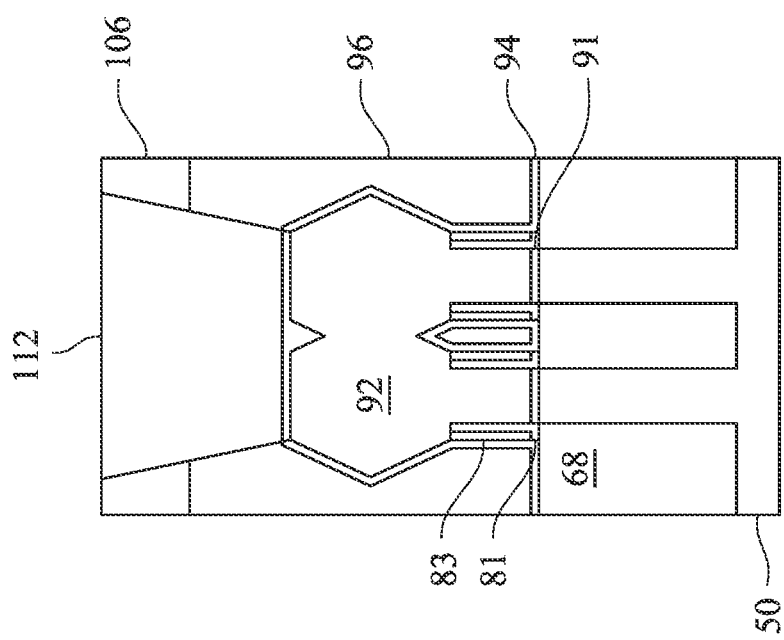

Next, in FIGS. 21A-C, contacts 112 and 114 (may also be referred to as contact plugs) are formed in the third recesses 108. The contacts 112 and 114 may each comprise one or more layers, such as barrier layers, diffusion layers, and fill materials. For example, in some embodiments, the contacts 112 and 114 each include a barrier layer and a conductive material, and is electrically coupled to the underlying conductive feature (e.g., gate electrodes 102 and/or silicide region 110 in the illustrated embodiment). The contacts 114 are electrically coupled to the gate electrodes 102 and may be referred to as gate contacts, and the contacts 112 are electrically coupled to the silicide regions 110 and may be referred to as source/drain contacts. The barrier layer may include titanium, titanium nitride, tantalum, tantalum nitride, or the like. The conductive material 118 may be copper, a copper alloy, silver, gold, tungsten, cobalt, aluminum, nickel, or the like. A planarization process, such as a CMP, may be performed to remove excess material from a surface of the second ILD 106.

Figure 21E:
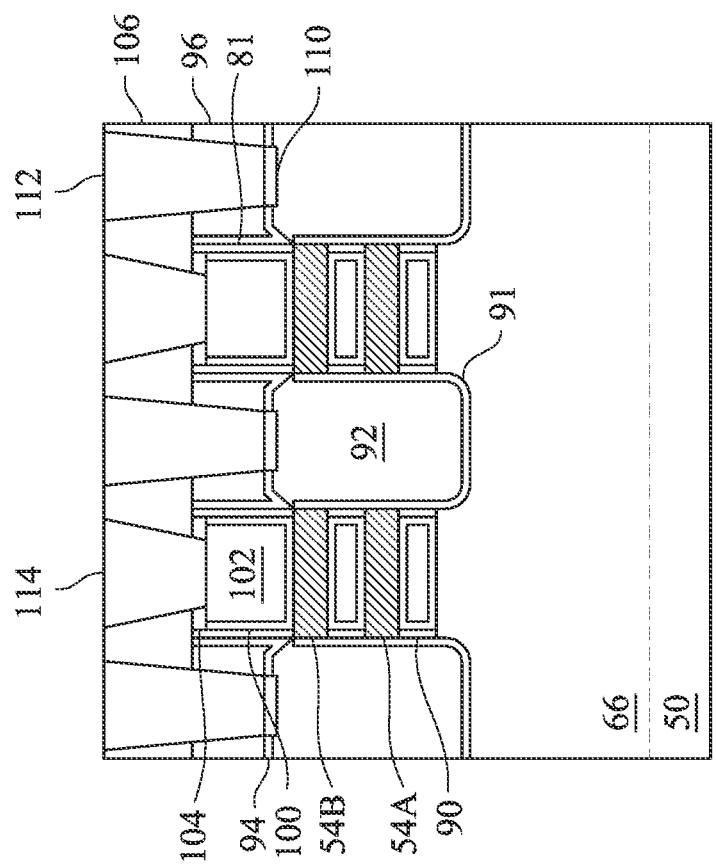
Figure 21D:
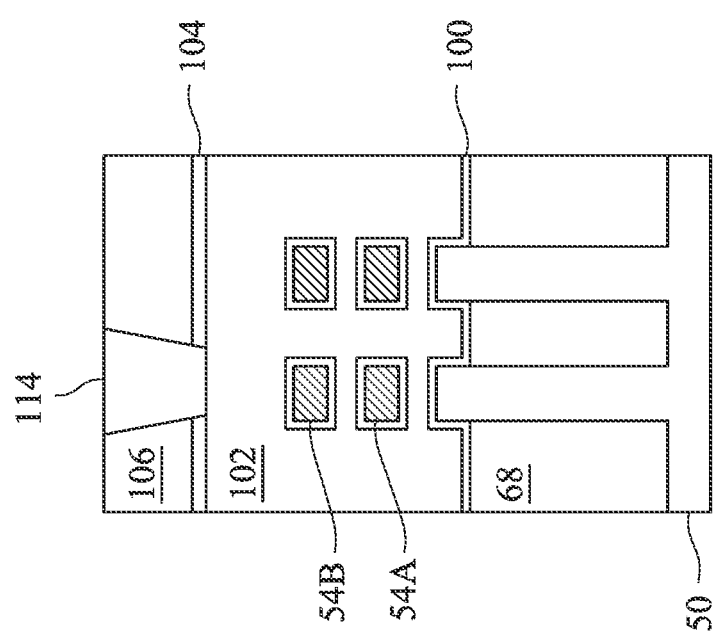

FIGS. 21A-C illustrate an embodiments having three nanostructures for illustrative purposes, and in some embodiments more or fewer nanostructures may be formed. For example, FIGS. 21D-E illustrate cross-sectional views of a device similar to the ones illustrated in FIGS. 21A-B, wherein like reference numerals refer to like features, having two first nanostructures 52A-B and two second nanostructures 54A-B are disposed over the fins 66.

FIGS. 22A-24B illustrate various manufacturing steps according to some embodiments. The process illustrated in FIGS. 22A-24B assume processes similar to those discussed above with reference to FIGS. 2-11C were previously performed. Accordingly, after first inner spacers 90 are formed as discussed above with reference to FIGS. 11A-11C, processing may proceed to FIGS. 22A-22B wherein bottom dielectric layers 95 are formed along a bottom of the first recesses 86. The bottom dielectric layers 95 may reduce substrate leakage and well isolation leakage.

Figure 22B:
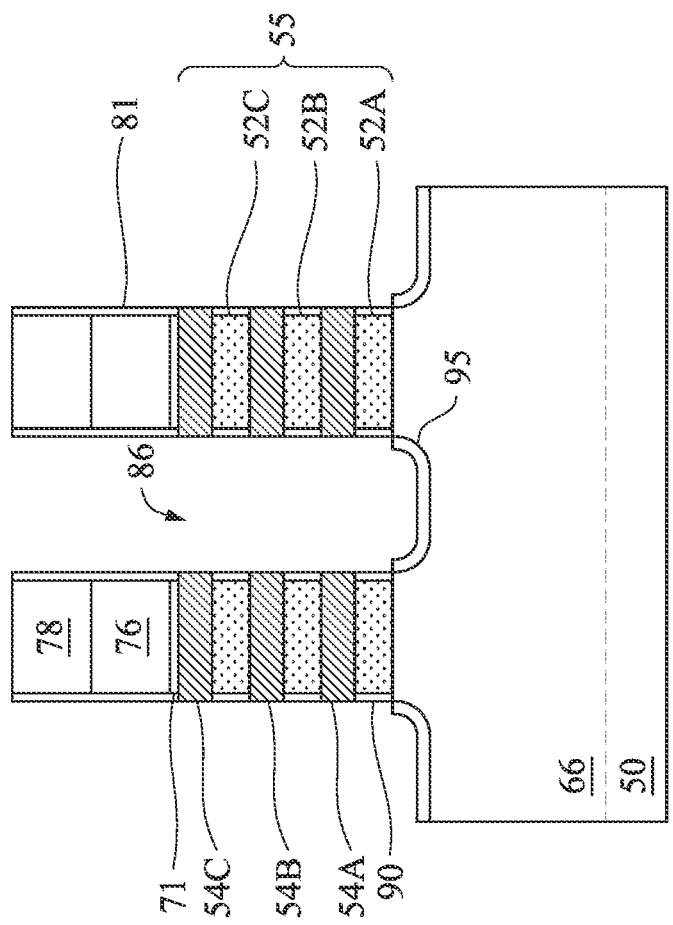
Figure 22A:
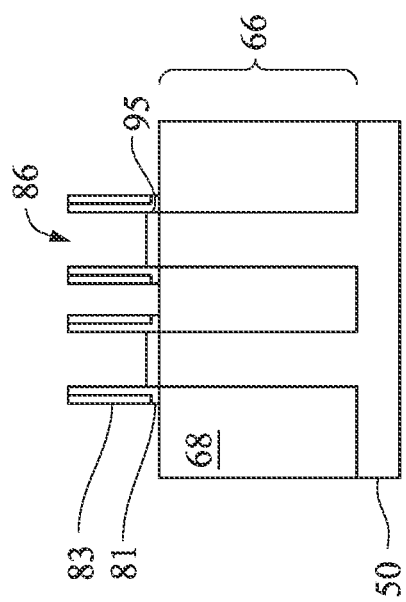

In some embodiments, the bottom dielectric layers 95 may be formed by depositing a dielectric material layer, such as silicon nitride, silicon carbon nitride, silicon oxycarbonitride, or the like, using techniques such as ALD, PVD, CVD, or the like. The dielectric material layer may be initially formed over the masks 78, along the sidewalls of the first spacers 81, and along a bottom and sidewall surfaces of the first recesses 86 (e.g., a top surface of the substrate 50 and sidewalls of the second nanostructures 54 and the first inner spacers 90). An implantation process may be performed to implant ions, such as carbon, oxygen, germanium, or combinations thereof, into the dielectric material layer along the horizontal surfaces such that dielectric material layer on the vertical surfaces such as along the sidewalls of the second nanostructures 54, the first inner spacers 90, and the first spacers 81 are implanted less or are substantially free of the ions. The implanted ions may lower the etch rate of the implanted portions of the dielectric material layer (e.g., portions of the dielectric material layer along the bottom of the first recesses 86) as compared to the un-implanted portions of the dielectric material layer along the sidewalls of the second nanostructures 54, the first inner spacers 90, and the first spacers 81. A subsequent etch process removes the dielectric layer from the sidewalls of the second nanostructures 54, the first inner spacers 90, the masks 78, and the first spacers 81, while leaving the dielectric material layer along the bottom of the first recesses 86 to form the bottom dielectric layers 95 as illustrated in FIG. 22B. The above description provide one method of forming the bottom dielectric layers 95, while other methods are possible.

In FIGS. 23A-B, the seeding layers 91 are formed in the first recesses 86 by similar methods as discussed previously with respect to FIGS. 12A-12B. In some embodiments, as shown in FIG. 23B, the seeding layers 91 are continuous U-shaped layers, with sidewalls covering the sidewalls of the second nanostructures 54 and the sidewalls of the first inner spacers 90. The bottom portions of the seeding layers 91 may be in direct contact with top surfaces of the bottom dielectric layers 95.

Figure 24A:
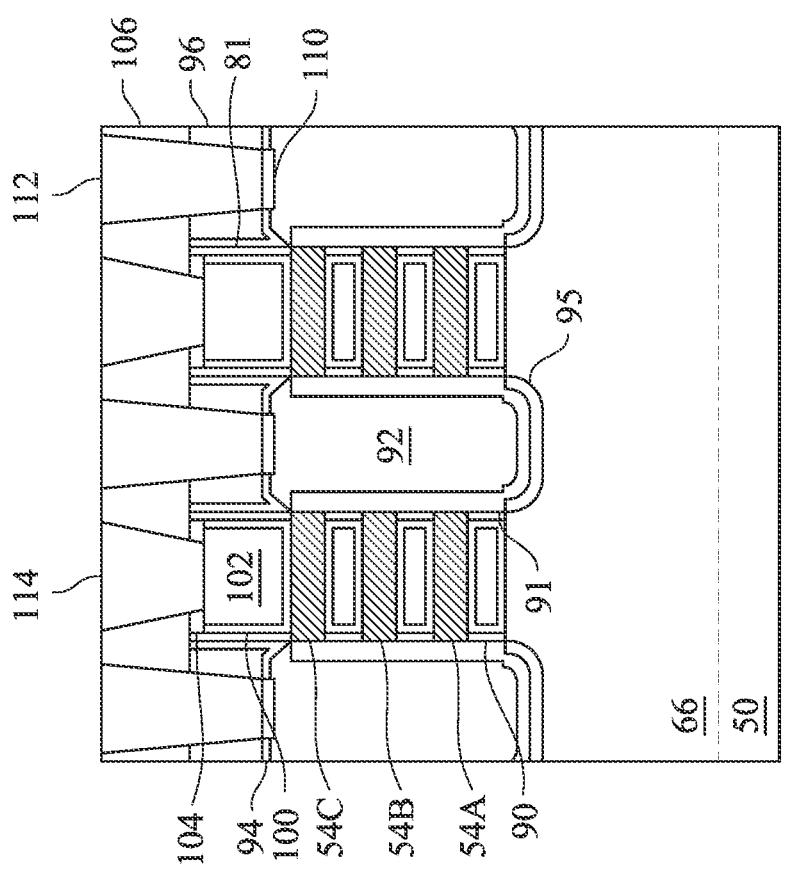
Figure 24B:
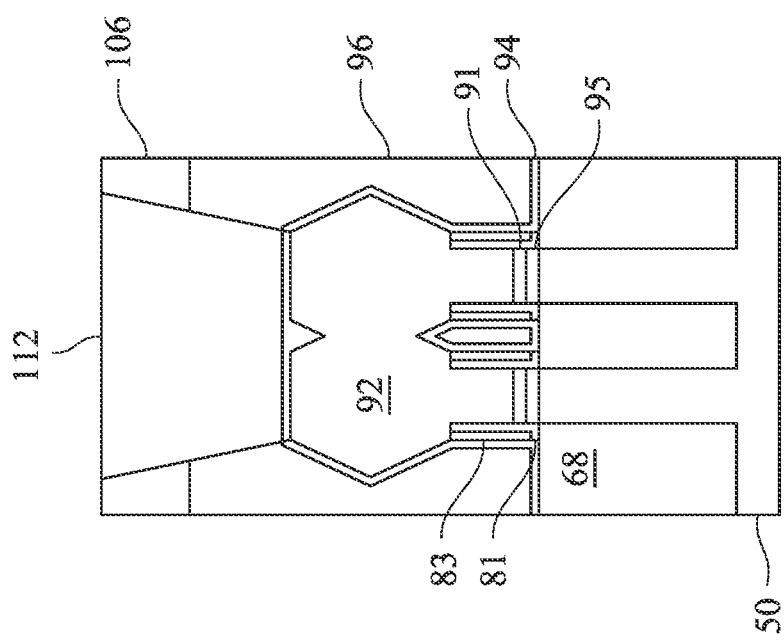

Thereafter, processes similar to those discussed above with reference to FIGS. 13A-21C may be performed to, for example, form epitaxial source/drain regions 92, the first ILD 96, gate electrodes 102, the second ILD 106, contacts 112, and contacts 114. FIGS. 24A-B illustrate cross-sectional views of a device similar to the ones illustrated in FIGS. 21B-C, wherein like reference numerals refer to like features. As illustrated in FIGS. 24A-B, the bottom dielectric layers 95 are disposed between the substrate 50 and the seeding layers 91. By forming the bottom dielectric layers 95 under the epitaxial source/drain regions 92, the substrate 50 is electrically isolated from the epitaxial source/drain region 92, which reduces substrate leakage and well isolation leakage, thereby improves the overall performance of the nano-FETs.

The embodiments described here have some advantages. For example, seeding layers may be formed over the sidewalls of nanostructures and gate inner spacers, and a substrate, prior to the formation of epitaxial source/drain regions over the seeding layers. By forming the seeding layers, the nucleation sites for the growth of the epitaxial source/drain regions are more abundant and more evenly distributed, which leads to increased uniformity of the epitaxial source/drain regions and reduced defects, such as voids and stacking faults, thereby improves the overall performance of the nano-FETs.

In an embodiment, a semiconductor device includes a plurality of nanostructures over a substrate; a gate structure wrapping around the plurality of nanostructures; a source/drain region adjacent the plurality of nanostructures; inner spacers between the source/drain region and the gate structure, wherein the source/drain region includes a first semiconductor layer covering sidewalls of the plurality of nanostructures and sidewalls of the inner spacers, wherein a cross-section of the first semiconductor layer is a continuous U-shaped semiconductor layer, wherein the first semiconductor layer is polycrystalline; and a second semiconductor layer over the first semiconductor layer, wherein the second semiconductor layer has a higher concentration of a first dopant than the first semiconductor layer. In an embodiment, the second semiconductor layer is monocrystalline. In an embodiment, the first semiconductor layer is in direct contact with the substrate. In an embodiment, the semiconductor device further includes a dielectric layer between the first semiconductor layer and the substrate, wherein the dielectric layer is in direct contact with the first semiconductor layer. In an embodiment, the first semiconductor layer is free of the first dopant. In an embodiment, a concentration of the first dopant in the first semiconductor layer is greater than 0 and less than $5 \times 10^{19}$ atoms/cm$^3$. In an embodiment, a concentration of the first dopant in the second semiconductor layer is greater than $2 \times 10^{21}$ atoms/cm$^3$. In an embodiment, the first dopant is phosphorus. In an embodiment, the first semiconductor layer has a thickness in a range between 0.5 nm and 3 nm.

In an embodiment, a method of forming a semiconductor device includes forming a stack of nanostructures over a substrate; forming a recess through the stack of nanostructures; depositing a first semiconductor layer in the recess, wherein the first semiconductor layer is amorphous; annealing the first semiconductor layer, wherein the annealing crystallizes a first portion of the first semiconductor layer; and depositing a second semiconductor layer over the first portion of the first semiconductor layer. In an embodiment, forming the first semiconductor layer further includes doping the first semiconductor layer with a dopant of a first conductivity type, wherein the first semiconductor layer has a first dopant concentration. In an embodiment, forming the second semiconductor layer further includes doping the second semiconductor layer with a dopant of the first conductivity type, wherein the second semiconductor layer has a second dopant concentration. In an embodiment, second dopant concentration is greater than the first dopant concentration. In an embodiment, the first portion of the first semiconductor layer is polycrystalline after annealing. In an embodiment, the method further includes removing a second portion of the first semiconductor layer before depositing the second semiconductor layer.

In an embodiment, a method of forming a semiconductor device includes forming a semiconductor stack, the semiconductor stack includes a plurality of sacrificial layers; and a plurality of nanostructures, wherein the plurality of sacrificial layers and the plurality of nanostructures are disposed on each other in an alternating fashion; forming a gate structure on the semiconductor stack; etching the semiconductor stack to form a recess adjacent the gate structure; forming a plurality of inner spacers on sidewalls of the plurality of sacrificial layers; and forming a source/drain region includes forming a first semiconductor layer in the recess, wherein the first semiconductor layer is formed on sidewalls of the plurality of nanostructures and sidewalls of the plurality of inner spacers, and wherein the first semiconductor layer comprises an amorphous semiconductor layer; crystallizing a portion of the first semiconductor layer; and forming a second semiconductor layer on the crystallized portion of first semiconductor layer. In an embodiment, the second semiconductor layer is crystalline. In an embodiment, forming the first semiconductor layer includes forming the first semiconductor layer along sidewalls of the gate structure. In an embodiment, after crystallizing, removing the first semiconductor layer from sidewalls of the gate structure. In an embodiment, the method further includes depositing a dielectric layer in the recess before forming the first semiconductor layer, wherein forming the first semiconductor layer comprises forming the first semiconductor layer over the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
   forming a stack of nanostructures over a substrate;
   forming a recess through the stack of nanostructures;
   depositing a first semiconductor layer in the recess, wherein the first semiconductor layer is amorphous;
   annealing the first semiconductor layer, wherein the annealing crystallizes a first portion of the first semiconductor layer; and
   depositing a second semiconductor layer over the first portion of the first semiconductor layer.

2. The method of claim 1, wherein forming the first semiconductor layer further comprises:
   doping the first semiconductor layer with a dopant of a first conductivity type, wherein the first semiconductor layer has a first dopant concentration.

3. The method of claim 2, wherein forming the second semiconductor layer further comprises:
   doping the second semiconductor layer with a dopant of the first conductivity type, wherein the second semiconductor layer has a second dopant concentration.

4. The method of claim 3, wherein the second dopant concentration is greater than the first dopant concentration.

5. The method of claim 1, wherein the first portion of the first semiconductor layer is polycrystalline after annealing.

6. The method of claim 1, further comprising:
   removing a second portion of the first semiconductor layer before depositing the second semiconductor layer.

7. A method of forming a semiconductor device, the method comprising:
   forming a semiconductor stack, the semiconductor stack comprising:
      a plurality of sacrificial layers; and
      a plurality of nanostructures, wherein the plurality of sacrificial layers and the plurality of nanostructures are disposed on each other in an alternating fashion;
   forming a gate structure on the semiconductor stack;
   etching the semiconductor stack to form a recess adjacent the gate structure;
   forming a plurality of inner spacers on sidewalls of the plurality of sacrificial layers; and
   forming a source/drain region comprising:
      forming a first semiconductor layer in the recess, wherein the first semiconductor layer is formed on sidewalls of the plurality of nanostructures and sidewalls of the plurality of inner spacers, and wherein the first semiconductor layer comprises an amorphous semiconductor layer;
      crystallizing a portion of the first semiconductor layer; and
      forming a second semiconductor layer on the crystallized portion of the first semiconductor layer.

8. The method of claim 7, wherein the second semiconductor layer is crystalline.

9. The method of claim 7, wherein forming the first semiconductor layer comprises forming the first semiconductor layer along sidewalls of the gate structure.

10. The method of claim 9, further comprising:
    after crystallizing, removing the first semiconductor layer from the sidewalls of the gate structure.

11. The method of claim 7, further comprising:
    depositing a dielectric layer in the recess before forming the first semiconductor layer, wherein forming the first semiconductor layer comprises forming the first semiconductor layer over the dielectric layer.

12. A method of forming a semiconductor device, the method comprising:
    forming a stack of nanostructures over a substrate;
    forming a recess through the stack of nanostructures; and
    forming a source/drain region in the recess comprising:
       forming a first semiconductor layer on sidewalls of the stack of nanostructures, wherein the first semiconductor layer is polycrystalline; and
       forming a second semiconductor layer on the first semiconductor layer, wherein the second semiconductor layer is monocrystalline.

13. The method of claim 12, wherein the first semiconductor layer is U-shaped in a cross-sectional view.

14. The method of claim 12, wherein the first semiconductor layer comprises a first dopant of a first concentration, wherein the second semiconductor layer comprises the first dopant of a second concentration, and wherein the second concentration is higher than the first concentration.

15. The method of claim 14, wherein the first dopant is phosphorus.

16. The method of claim 14, wherein the first concentration is in a range between 0 and $5 \times 10^{19}$ atoms/cm$^3$.

17. The method of claim 14, wherein the second concentration is greater than $2 \times 10^{21}$ atoms/cm$^3$.

18. The method of claim 12, wherein forming the first semiconductor layer comprises:
   depositing the first semiconductor layer as an amorphous layer; and
   annealing the first semiconductor layer to crystallize the first semiconductor layer.

19. The method of claim 12, wherein the first semiconductor layer is in contact with the substrate.

20. The method of claim 12, further comprising forming a dielectric layer on the substrate, wherein the first semiconductor layer is in contact with the dielectric layer.

* * * * *